(12) United States Patent
Yu et al.

(10) Patent No.: US 11,620,504 B2
(45) Date of Patent: Apr. 4, 2023

(54) NEUROMORPHIC DEVICE BASED ON MEMORY

(71) Applicant: Samsung Electronics Co., Ltd., Suwon-si (KR)

(72) Inventors: Hak-Soo Yu, Hanam-si (KR); Nam Sung Kim, Yongin-si (KR); Kyomin Sohn, Yongin-si (KR); Jaeyoun Youn, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 351 days.

(21) Appl. No.: 16/892,637

(22) Filed: Jun. 4, 2020

(65) Prior Publication Data

US 2021/0150319 A1    May 20, 2021

(30) Foreign Application Priority Data

Nov. 15, 2019  (KR) .................... 10-2019-0146341

(51) Int. Cl.
| | | |
|---|---|---|
| *G06N 3/063* | (2006.01) | |
| *G06N 3/08* | (2006.01) | |
| *G11C 11/408* | (2006.01) | |
| *G11C 11/4091* | (2006.01) | |
| *G11C 11/4096* | (2006.01) | |
| *G11C 11/54* | (2006.01) | |
| *G11C 11/56* | (2006.01) | |

(52) U.S. Cl.
CPC .............. *G06N 3/063* (2013.01); *G06N 3/08* (2013.01); *G11C 11/4087* (2013.01); *G11C 11/4091* (2013.01); *G11C 11/4096* (2013.01); *G11C 11/54* (2013.01); *G11C 11/565* (2013.01)

(58) Field of Classification Search
CPC ...... G06N 3/063; G06N 3/08; G11C 11/4087; G11C 11/4091; G11C 11/4096; G11C 11/54; G11C 11/565
USPC .......................................................... 706/25
See application file for complete search history.

(56) References Cited

U.S. PATENT DOCUMENTS

| | | |
|---|---|---|
| 7,643,354 B2 | 1/2010 | Landfield et al. |
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,909,576 B2 | 12/2014 | Akopyan et al. |
| 9,542,643 B2 | 1/2017 | Levin et al. |
| 10,360,971 B1 | 7/2019 | Hokenmaier et al. |
| 2011/0233648 A1 | 9/2011 | Seol et al. |
| 2018/0189645 A1 | 7/2018 | Chen et al. |

(Continued)

FOREIGN PATENT DOCUMENTS

| | | |
|---|---|---|
| JP | 2018-133016 A | 8/2018 |
| JP | 2018133016 A * | 8/2018 |

*Primary Examiner* — Ly D Pham
(74) *Attorney, Agent, or Firm* — Harness, Dickey & Pierce, P.L.C.

(57) ABSTRACT

A neuromorphic device includes a memory cell array that includes first memory cells corresponding to a first address and storing first weights and second memory cells corresponding to a second address and storing second weights, and a neuron circuit that includes an integrator summing first read signals from the first memory cells and an activation circuit outputting a first activation signal based on a first sum signal of the first read signals output from the integrator.

16 Claims, 19 Drawing Sheets

(56) References Cited

U.S. PATENT DOCUMENTS

2018/0300619 A1  10/2018  Lee
2018/0314929 A1  11/2018  Lee

* cited by examiner

US 11,620,504 B2

NEUROMORPHIC DEVICE BASED ON MEMORY

CROSS-REFERENCE IO RELATED APPLICATIONS

This application claims priority under 35 U.S.C. § 119 to Korean Patent Application No. 10-2019-0146341 filed on Nov. 15, 2019, in the Korean Intellectual Property Office, the disclosures of which are incorporated by reference herein in their entirety.

BACKGROUND

The inventive concepts relate to a neuromorphic device, and more particularly, relate to a memory-based neuromorphic device.

Artificial neural networks that are similar to biological neural networks are in the spotlight. The artificial neural networks are being used in various fields such as machine learning, selection, inference, prediction, recognition, analysis, translation, and diagnosis. The artificial neural networks may include artificial neurons that are similar to biological neurons (e.g., neural cells) and form a plurality of layers. A synapse weight may indicate a connection strength between the artificial neurons and may be learned and changed through machine learning.

As the number of layers of an artificial neural network and the number of artificial neurons increases, the synapse weights and biases indicating connection strengths between artificial neurons are also increasing. In the case of implementing an artificial neural network at a semiconductor chip, technologies for high integration and low power are beneficial in storing the increasing synapse weights and biases and in implementing a plurality of artificial neurons.

SUMMARY

Embodiments of the inventive concepts provide a memory-based neuromorphic device.

According to an example embodiment, a neuromorphic device may include a memory cell array that includes first memory cells corresponding to a first address, the first memory cells configured to store first weights, and second memory cells corresponding to a second address, the second memory cells configured to store second weights, and a first neuron circuit including a first integrator and a first activation circuit, the first integrator configured to sum first read signals from the first memory cells and output a first sum signal to the first activation circuit and to sum second read signals from the second memory cells and output second sum signals to the activation circuit, and the first activation circuit configured to output a first activation signal based on the first sum signal and output a second activation signal based on the second sum signals of the first read signals output from the integrator.

BRIEF DESCRIPTION OF THE FIGURES

The above and other objects and features of the inventive concepts will become apparent by describing in detail example embodiments thereof with reference to the accompanying drawings.

DETAILED DESCRIPTION

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
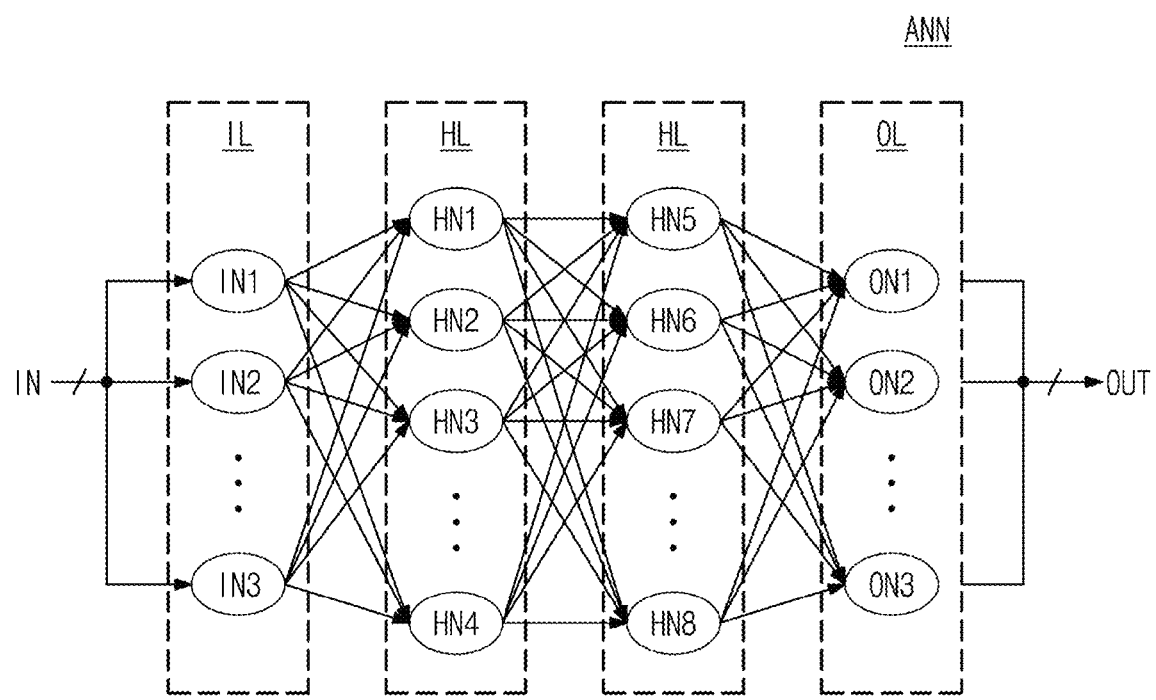
FIG. 1 illustrates an artificial neural network according to an embodiment of the inventive concepts.

FIG. 1 illustrates an artificial neural network according to an embodiment of the inventive concepts.

The artificial neural network ANN may include an input layer IL, at least one hidden layer HL, and an output layer OL. For example, the artificial neural network ANN may be a deep neural network (DNN), a recurrent neural network (RNN), a convolutional neural network (CNN), a spiking neural network (SNN), etc. The input layer IL may include a plurality of input nodes IN1 to IN3 and may receive input data IN. The output layer OL may include a plurality of output nodes ON1 to ON3 and may output output data OUT based on data passing through at least one hidden layers HL. The at least one hidden layers HL may include a plurality of hidden nodes HN1 to HN8 and may configure the connections between the input layer IL and the output layer OL. Although the example number of nodes IN1 to IN3, HN1 to HN8, and ON1 to ON3 constituting the respective layers IL, HL, and OL illustrated in FIG. 1, the number of hidden layers HL, and connection relationships between the nodes IN1 to IN3, HN1 to HN8, and ON1 to ON3 are illustrated in the present embodiments, the numbers of nodes, layers, and connections may be more or less. For example, one or more modes nodes INTI to IN3, HN1 to HN8, and ON1 to ON3, one or more hidden layers HL, and one or more connection relationships between the nodes IN1 to IN3, HN1 to HN8, and ON1 to ON3 may be further included in the artificial neural network ANN. A node may be an artificial neuron corresponding to a neuron of a biological neural network and may be referred to as a "neuron circuit or a "perceptron." The connection strength between neuron circuits may correspond to a connection strength of a synapse of the biological neural network, and the connection strength between neuron circuits may be expressed by a weight (e.g., a synapse weight). As in the neuron of the biological neural network, a neuron circuit may output an activation signal to other neuron circuits, based on signals from other neuron circuits, weights for the other neuron circuits, biases, and a threshold value of the neuron circuit. A hardware device in which the artificial neural network ANN is implemented and that executes the artificial neural network ANN will be described below.

Figure 2:
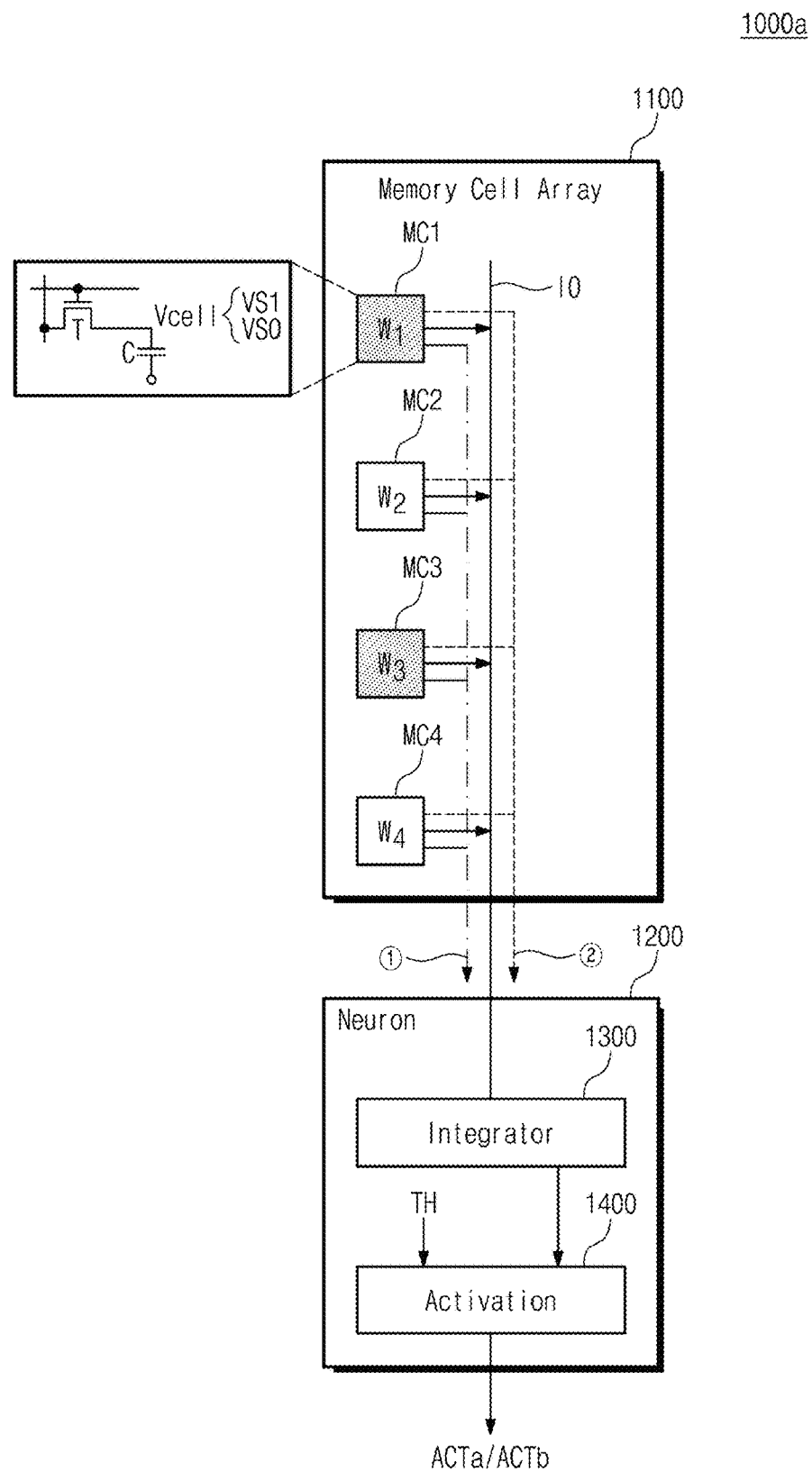
FIG. 2 illustrates a block diagram of a neuromorphic device according to an embodiment of the inventive concepts.

FIG. 2 illustrates a block diagram of a neuromorphic device according to an embodiment of the inventive concepts.

A neuromorphic device 1000a may be a "neuromorphic computing device", a "neuromorphic chip", a "neuromorphic processor", a "neuromorphic system", a "neural network accelerator", a "neural network accelerator chip", an "artificial intelligence (AI) processor", an "AI memory device", a "processor", a "memory device", or combination thereof. The neuromorphic device 1000a may be a memory-based neuromorphic device using a structure or an architecture of a memory device storing data. In some example embodiments, the neuromorphic device 1000a may include a plurality of processing elements that concurrently and/or simultaneously perform processing of the neural network, such as a set of processing elements that concurrently and/or simultaneously sum weights on several channels. In some example embodiments, the neuromorphic device 1000a may be configured to process the neural network sequentially, such as a sequence of operations for each of several channels as will be described below. The neuromorphic device 1000a may include a memory cell array 1100 and a neuron circuit 1200.

The memory cell array 1100 may include memory cells MC1 to MC4. For example, each of the memory cells MC1 to MC4 may be one of a static random access memory (SRAM) cell, a dynamic random access memory (DRAM) cell, a thyristor random access memory (TRAM) cell, a NAND flash memory cell, a NOR flash memory cell, a resistive random access memory (RRAM) cell, a ferroelectric random access memory (FRAM) cell, a phase change random access memory (PRAM) cell, and a magnetic random access memory (MRAM) cell. Each of the memory cells MC1 to MC4 may be a DRAM cell including a cell transistor "T" and a cell capacitor "C," and the neuromorphic device 1000a may be a DRAM-based neuromorphic device. However, the inventive concepts are not limited thereto. For example, each of the memory cells MC1 to MC4 may store a single bit. A cell voltage level Vcell (e.g., a storage voltage) of each of the memory cells MC1 to MC4 may correspond to one of the voltage levels VS0 and VS1 indicating logic values (e.g., "0" and "1") expressed by a single bit and are different from each other. For example, each of the memory cells MC1 to MC4 may correspond to a single level cell (SLC). Weights $W_1$ to $W_4$ may be respectively written in the memory cells MC1 to MC4 through an input/output line IO (e.g., an input and output line IO). The memory cells MC1 to MC4 may store the weights $W_1$ to $W_4$, respectively. Each of the weights $W_1$ to $W_4$ may indicate a connection strength of the neuron circuit 1200. Although not illustrated in FIG. 2, at least one of the memory cells MC1 to MC4 may store a bias instead of a weight, or another memory cell other than the memory cells MC1 to MC4 may store a bias. For example, the number of bits of a weight and the number of bits of a bias may correspond to the number of bits that each of the memory cells MC1 to MC4 is capable of storing. For example, the memory cells MC1 to MC4 may be respectively accessed through one input/output line IO. Although the number of memory cells MC1 to MC4 are illustrated in the present embodiment, the number of memory cells may be more or less than illustrated, for example, one or more memory cells may be further included in the memory cell array 1100. Corresponding weights and/or biases may be respectively written and/or stored in the one or more further included memory cells.

The neuron circuit 1200 may include an integrator 1300 and an activation circuit 1400. The integrator 1300 may receive the weights $W_1$ to $W_4$ transmitted from the memory cells MC1 to MC4 through the input/output line IO. The integrator 1300 may integrate, sum, and/or accumulate at least a part of the weights $W_1$ to $W_4$. In the case where a part of the memory cells MC1 to MC4 stores a bias instead of a weight, the integrator 1300 may receive and sum the weight(s) and bias(es). The integrator 1300 may be referred to as an "accumulator" or an "adder." For example, the integrator 1300 may sum at least one or more weights of the weights $W_1$ to $W_4$ at the input/output line IO. The integrator 1300 may sum a plurality of bits of weights at the one input/output line IO. The integrator 1300 may provide a sum signal indicating a sum result to the activation circuit 1400.

The activation circuit 1400 may output, generate, enable, and/or fire an activation signal ACTa/ACTb based on the sum signal of the integrator 1300. For example, the activation circuit 1400 may output the activation signal ACTa/ACTb by comparing a threshold signal TH (or referred to as a "threshold value," a "reference signal," or a "reference value") with the sum signal of the integrator 1300. When the sum signal of the integrator 1300 exceeds the threshold signal TH, the activation circuit 1400 may output and/or enable the activation signal ACTa/ACTb, or, for example, if the sum signal of the integrator 1300 does not exceed the threshold signal TH, the activation circuit 1400 may disable and/or not output the activation signal ACTa/ACTb. The activation signal ACTa/ACTb may be referred to as an "output signal." The activation circuit 1400 may output the activation signal ACTa/ACTb by using various activation functions such as a step function, a sigmoid function, a rectified linear unit (ReLU) function, a leaky ReLU function, and a Tanh function.

For example, because at least one or more weights are repeatedly transmitted through the input/output line IO, the neuron circuit 1200 may be reused. The integrator 1300 may sum read signals from the memory cells MC1 and MC3 storing the weights $W_1$ and $W_3$ at the one input/output line IO (①). The activation circuit 1400 may output the activation signal ACTa by comparing a sum signal, which the integrator 1300 outputs as a sum of the weights $W_1$ and $W_3$, with the threshold signal TH. Next, the integrator 1300 may further sum read signals from the memory cells MC2 and MC4 storing the weights $W_2$ and $W_4$ at the one input/output line IO (②). The activation circuit 1400 may further output the activation signal ACTb by comparing a sum signal, which the integrator 1300 outputs as a sum of the weights $W_2$ and $W_4$, with the threshold signal TH. Because the one neuron circuit 1200 repeatedly and differently receives at least a part of the different weights $W_1$ to $W_4$ through the input/output line IO and repeatedly and differently outputs the activation signals ACTa and ACTb, the neuron circuit 1200 may be reused. At least one of the weights $W_2$ and $W_4$ may indicate the connection strength between the neuron circuit 1200 receiving the read signals from the memory cells MC1 and MC3 and the neuron circuit 1200 receiving the read signals from the memory cells MC2 and MC4. The two neuron circuits 1200 described above are examples of one neuron circuit 1200 physically implemented, but the neuron circuit 1200 may operate as two or more nodes of the artificial neural network ANN and may be reused.

In an example embodiment, the memory cells MC1 to MC4 may be selected to output the read signals from the memory cells MC1 to MC4. The memory cells MC1 and MC3 may be selected in the case of "①," and the memory cells MC2 and MC4 may be selected in the case of "②." For example, the read signals from the memory cells MC1 to MC4 may correspond to products of addresses for selecting the memory cells MC1 to MC4 and the weights $W_1$ to $W_4$ stored in the memory cells MC1 to MC4. In another example, the read signals from the memory cells MC1 to MC4 may include weights and/or biases stored in the memory cells MC1 to MC4. The number of memory cells of the memory cell array 1100, a location of a selected memory cell, the number of selected memory cells, etc. are only examples, and may be adjusted accordingly.

Figure 3:
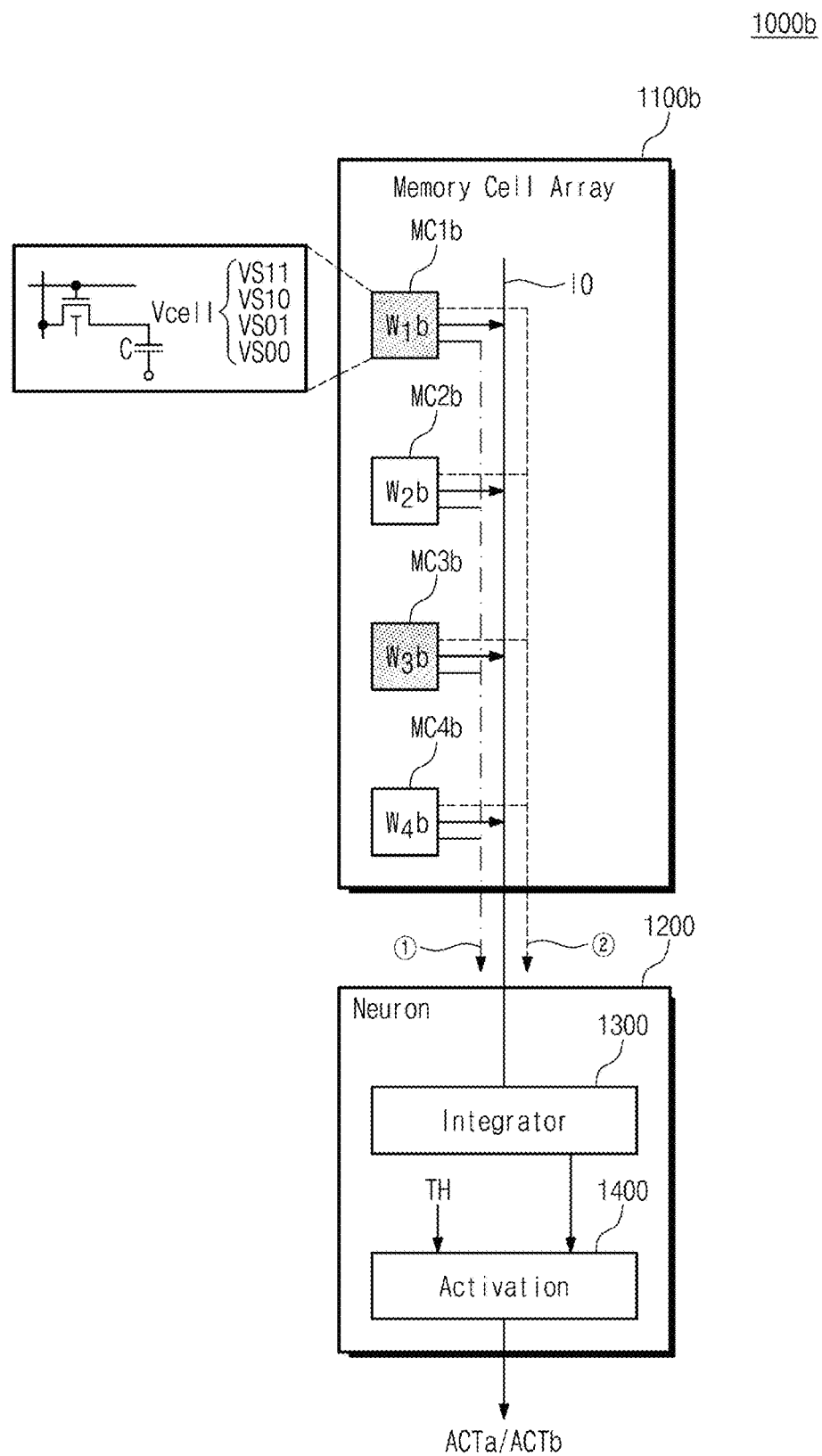
FIG. 3 illustrates a block diagram of a neuromorphic device according to another embodiment of the inventive concepts.

FIG. 3 illustrates a block diagram of a neuromorphic device according to another embodiment of the inventive concepts. Additional description associated with components having the same reference numerals will be omitted to avoid redundancy, and the differences between neuromorphic devices 1000a and 1000b will be mainly described.

The neuromorphic device 1000b may include the memory cell array 1100b and the neuron circuit 1200. The memory cell array 1100b may include the memory cells MC1b to MC4b. As in the neuromorphic device 1000a, each of the memory cells MC1b to MC4b may be a DRAM cell including the cell transistor "T" and the cell capacitor "C," but each of the memory cells MC1b to MC4b may store two bits. The cell voltage level Vcell of each of the memory cells MC1b to MC4 may correspond to one of voltage levels VS00, VS01, VS10, and VS11 indicating logic values (e.g., 00, 01, 10, and 11) expressed by two bits and that are different from each other. In this case, a weight and/or bias that is stored in each of the memory cells MC1b to MC4b may be composed of two bits. In an embodiment, each of the memory cells MC1b to MC4b may store two or more bits, the cell voltage level Vcell may be further subdivided to indicate logic values expressed by two or more bits, and a weight and/or bias may have two or more bits. Each of the memory cells MC1b to MC4b may correspond to a multi-level cell (MLC), a triple level cell (TLC), a quad level cell (QLC), etc.

The neuron circuit 1200 may be reused regardless of the number of bits that each of the memory cells MC1b to MC4b is capable of storing. The integrator 1300 may sum read signals from the memory cells MC1b and MC3b storing the weights $W_1$b and $W_3$ b each being a multi-bit at the one input/output line IO (①). The activation circuit 1400 may output the activation signal ACTa by comparing a sum signal, which the integrator 1300 outputs as a sum of the weights $W_1$b and $W_3$ b, with the threshold signal TH. Next, the integrator 1300 may further sum read signals from the memory cells MC2 and MC4 storing the weights $W_2$b and $W_4$b each being a multi-bit at the one input/output line IO (②). The activation circuit 1400 may further output the activation signal ACTb by comparing a sum signal, which the integrator 1300 outputs as a sum of the weights $W_2$b and $W_4$b, with the threshold signal TH. In the description above, unless otherwise defined, a memory cell may store a single bit or may store two or more bits.

Figure 4:
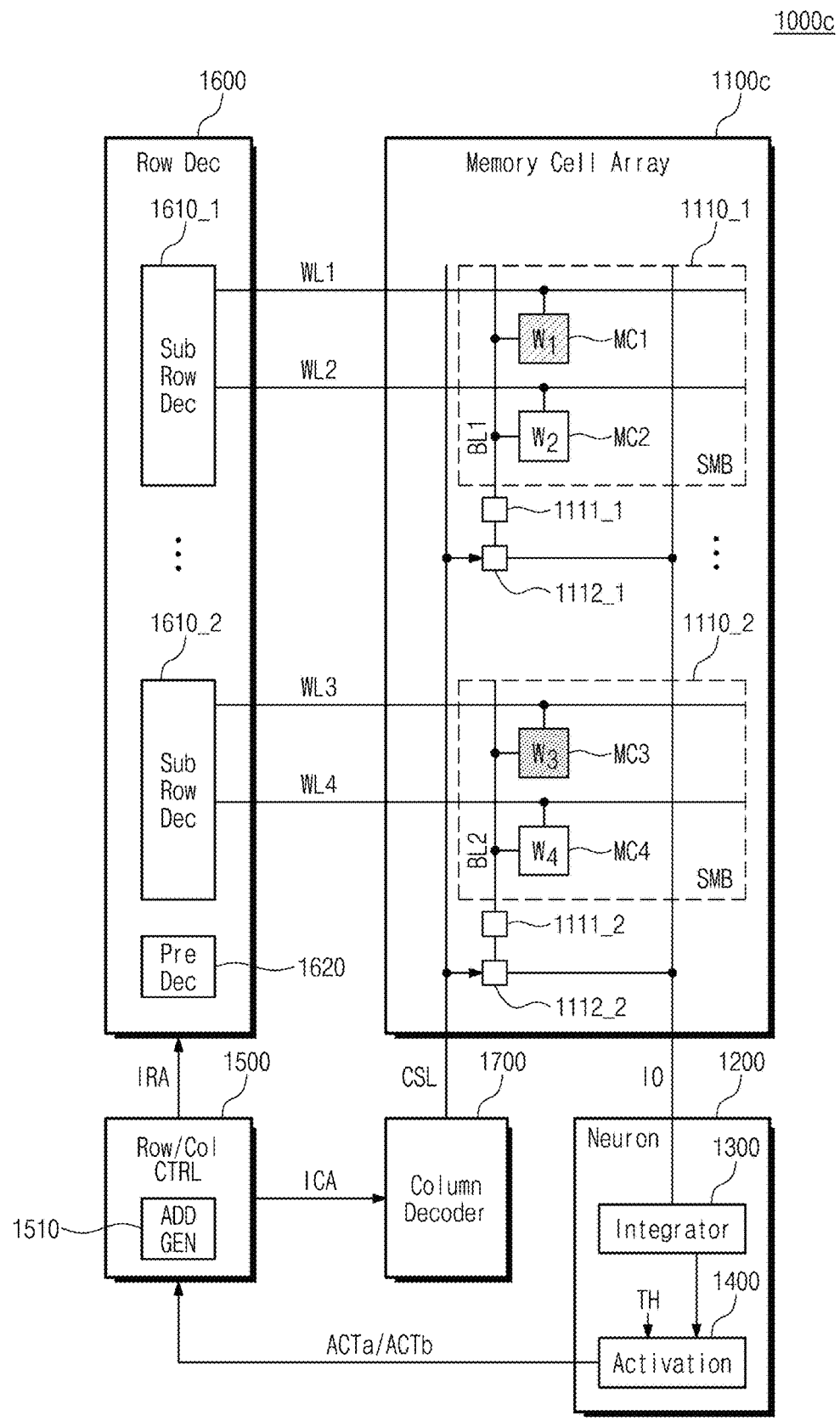
FIG. 4 illustrates a block diagram of a neuromorphic device according to another embodiment of the inventive concepts.

FIG. 4 illustrates a block diagram of a neuromorphic device 1000c according to another embodiment of the inventive concepts. Additional descriptions associated with components having the same reference numerals will be omitted to avoid redundancy, and the differences between neuromorphic devices 1000a, 1000b, and 1000c will be mainly described.

The memory cell array 1100c may include sub memory blocks 1110_1 to 1110_2. All the memory cells of the memory cell array 1100 may be divided into the sub memory blocks 1110_1 to 1110_2. The sub memory block 1110_1 may include the memory cells MC1 and MC2. The memory cells MC1 and MC2 may be respectively connected (e.g., coupled) to word lines WL1 and WL2 and may be connected in common with a bit line BL1. The sub memory block 1110_2 may include the memory cells MC3 and MC4. The memory cells MC3 and MC4 may be respectively connected to word lines WL3 and WL4 and may be connected in common with a bit line BL2.

The memory cell array 1100c may include a bit line sense amplifier 1111_1 connected to the bit line BL1. The bit line sense amplifier 1111_1 may sense and/or amplify a voltage level of the bit line BL1, which may change as one of the memory cells MC1 and MC2 is selected. For example, only one of the memory cells MC1 and MC2 connected to the bit line sense amplifier 1111_1 may be selected. The memory cell array 1100 may further include a bit line sense amplifier 1111_2 connected to the bit line BL2. The bit line sense amplifier 1111_2 may sense and amplify a voltage level of the bit line BL2, which may change as one of the memory cells MC3 and MC4 is selected. For example, only one of the memory cells MC3 and MC4 connected to the bit line sense amplifier 1111_2 may be selected. Though the memory cell array 1100c is illustrated at including memory cells MC1 to MC4, the memory cell array may include, for example, memory cells MC1b to MC4b.

The bit line sense amplifier 1111_1 may restore a weight and/or bias by again storing a voltage level. The stored voltage level may be obtained by sensing and/or amplifying the voltage level of the bit line BL1 in the memory cell selected from the memory cells MC1 and MC2. Similarly, the bit line sense amplifier 1111_2 may restore a weight and/or bias by storing a voltage level, which may be obtained by sensing and/or amplifying the voltage level of the bit line BL2, in the memory cell selected from the memory cells MC3 and MC4. An access (e.g., read) operation to the selected memory cells may be nondestructive.

The memory cell array 1100c may further include a column selection switch 1112_1 that electrically connects the bit line BL1 to the input/output line IO. The column selection switch 1112_1 may electrically connect the bit line BL1 to the input/output line IO based on a column selection signal transmitted through a column selection line CSL. The memory cell array 1100c may further include a column selection switch 1112_2 that electrically connects the bit line BL2 to the input/output line IO. The column selection switch 1112_2 may electrically connect the bit line BL2 to the input/output line IO based on the column selection signal transmitted through the column selection line CSL. For example, each of the column selection switches 1112_1 and 1112_2 may be connected to the same column selection line CSL and may receive the same column selection signal through the same column selection line CSL. The column selection signal may allow each of the bit lines BL1 and BL2 to be electrically connected to the same input/output line IO.

However, the number of sub memory blocks of the memory cell array 1100, the number of memory cells per sub memory block, the number of word lines per sub memory block, and the number of bit lines per sub memory block all are only an example embodiment, and the number thereof may be more or less than illustrated. Also, for example, the bit line sense amplifiers 1111_1 may be disposed adjacent to the sub memory block 1110_1 as much as the number of bit lines BL1 belonging to the sub memory block 1110_1, and bit line sense amplifiers 1111_2 may be disposed adjacent to the sub memory block 1110_2 as much as the number of bit lines BL2 belonging to the sub memory block 1110_2. The bit line sense amplifiers 1111_1 and 1111_2 and the column selection switches 1112_1 and 1112_2 may be interposed between the sub memory blocks 1110_1 to 1110_2. The sub memory block 1110_1 may be interposed between the bit line sense amplifier 1111_1 and another bit line sense amplifier adjacent to the sub memory block 1110_1. The memory cells MC1 to MC4 may be implemented to be identical to each other, the sub memory blocks 1110_1 to 1110_2 may be implemented to be identical to each other, the bit line sense amplifiers 1111_1 to 1111_2 may be implemented to be identical to each other, and the column selection switches 1112_1 to 1112_2 may be implemented to be identical to each other.

The neuromorphic device 1000c may further include a row/column controller 1500 including an address generator 1510, a row decoder 1600, and a column decoder 1700. The row/column controller 1500 may control the row decoder 1600 and the column decoder 1700 based on the activation signals ACTa and ACTb. The address generator 1510 may generate an address for selecting at least a part of the memory cells MC1 to MC4 of the memory cell array 1100 based on the activation signals ACTa and ACTb. The address generator 1510 may generate an internal row address IRA and an internal column address ICA whenever each of the activation signals ACTa and ACTb is received. For example, the address generator 1510 may include a counter that performs a counting operation in response to the activation signals ACTa and ACTb and generates a counting value (or an address). Also, based on the activation signals ACTa and ACTb, the row/column controller 1500 may provide the row decoder 1600 with a control signal for controlling the row decoder 1600 such that word lines corresponding to the internal row address IRA are selected. Based on the activation signals ACTa and ACTb, the row/column controller 1500 may provide the column decoder 1700 with a control signal for controlling the column decoder 1700 such that column selection lines corresponding to the internal column address ICA are selected.

The row decoder 1600 may decode the internal row address IRA and may select at least one of the word lines WL1 to WL4 connected to the memory cells MC1 to MC4 of the memory cell array 1100c. For example, in the case of "①" of FIG. 2 and/or FIG. 3, the row decoder 1600 may decode the internal row address IRA and may select the word lines WL1 and WL3. For example, in the case of "②" of FIG. 2 and/or FIG. 3, the row decoder 1600 may decode the internal row address IRA and may select the word lines WL2 and WL4. The internal row address IRA provided to the row decoder 1600 in the case of "①" and the internal row address IRA provided to the row decoder 1600 in the case of "②" may be different from each other.

The row decoder 1600 may include sub row decoders 1610_1 to 1610_2 and a pre-row decoder 1620. For example, the sub row decoder 1610_1 may decode the internal row address IRA and select one of the word lines WL1 and WL2 belonging to the sub memory block 1110_1. The sub row decoder 1610_2 may decode the internal row address IRA and select one of the word lines WL3 and WL4 belonging to the sub memory block 1110_2. The sub row decoders 1610_1 to 1610_2 may be implemented to be identical to each other. The row decoder 1600 may include sub row decoders as much as the number of sub memory blocks of the memory cell array 1100.

The pre-row decoder 1620 may decode the internal row address IRA prior to the sub row decoders 1610_1 to 1610_2 and/or may select the sub row decoders 1610_1 to 1610_2. For example, the pre-row decoder 1620 may set, to a Don't Care bit, an upper bit of a row address bit that is used to select word lines of each of the sub memory blocks 1110_1 and 1110_2. In this case, the pre-row decoder 1620 may simultaneously select two or more sub row decoders 1610_1 and 1610_2. In the case of "①" of FIG. 2 and/or FIG. 3, to select the memory cells MC1 and MC3, the pre-row decoder 1620 may simultaneously select the sub row decoders 1610_1 and 1610_2, and the sub row decoders 1610_1 and 1610_2 may select the word lines WL1 and WL3, respectively. In the case of "②" of FIG. 2 and/or FIG. 3, to select the memory cells MC2 and MC4, the pre-row decoder 1620 may simultaneously select the sub row decoders 1610_1 and 1610_2, and the sub row decoders 1610_1 and 1610_2 may select the word lines WL2 and WL4, respectively. For another example, the pre-row decoder 1620 may select one of the sub row decoders 1610_1 and 1610_2. In this case, one word line may be selected from the memory cell array 1100.

The column decoder 1700 may decode the internal column address ICA and may transmit (e.g., output) the column selection signal through the column selection line CSL. For example, the column decoder 1700 may start a selection operation after a selection operation of the row decoder 1600 is initiated. As described above, the column decoder 1700 may transmit the column selection signal to each of the column selection switches 1112_1 to 1112_2. The column decoder 1700 may select bit lines BL1 to BL2 by transmitting the column selection signal. Therefore, when the row decoder 1600 simultaneously selects two or more word lines WL1 and WL3 or WL2 and WL4, then the bit line sense amplifiers 1111_1 and 1111_2 sense and amplify the weights $W_1$ and $W_3$ or $W_2$ and $W_4$ of the memory cells MC1 and MC3 or MC2 and MC4, and then the column selection signal is applied to the column selection switches 1112_1 and 1112_2, the weights $W_1$ and $W_3$ or $W_2$ and $W_4$ may be simultaneously transmitted (or provided) to the input/output line IO. The integrator 1300 may sum the weights $W_1$ and $W_3$ at the input/output line IO or may sum the weights $W_2$ and $W_4$ at the input/output line IO. Here, because the memory cells MC1 and MC2 are capable of being connected to the bit line BL1, the bit line BL1 is capable of being connected to the column selection switch 1112_1, the memory cells MC3 and MC4 are capable of being connected to the bit line BL2, the bit line BL2 is capable of being connected to the column selection switch 1112_2, and the column selection switches 1112_1 and 1112_2 are capable of being connected to the same column selection line CSL, the internal column addresses ICA corresponding to the memory cells MC1 to MC4 may be identical.

In an embodiment, the address generator 1510 may sequentially increase or decrease the internal row address IRA and may sequentially increase or decrease the internal column address ICA. For example, the row decoder 1600 may decode the internal row address IRA and may select the word lines WL1 and WL3, and the column decoder 1700 may decode the internal column address ICA and may select the column selection line CSL. Next, the row decoder 1600 may decode the internal row address IRA increased or decreased depending on the activation signal ACTa and may select the word lines WL2 and WL4, and the column decoder 1700 may decode the internal column address ICA and may select the column selection line CSL. For example, the row decoder 1600 and the column decoder 1700 may sequentially select the memory cells MC1 and MC3 and the memory cells MC2 and MC4.

The integrator 1300, activation circuit 1400, row/column decoder 1500, the row decoder 1600, the column decoder 1700, the address generator 1510, and pre-row decoder 1620 may comprise processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc."

Figure 5:
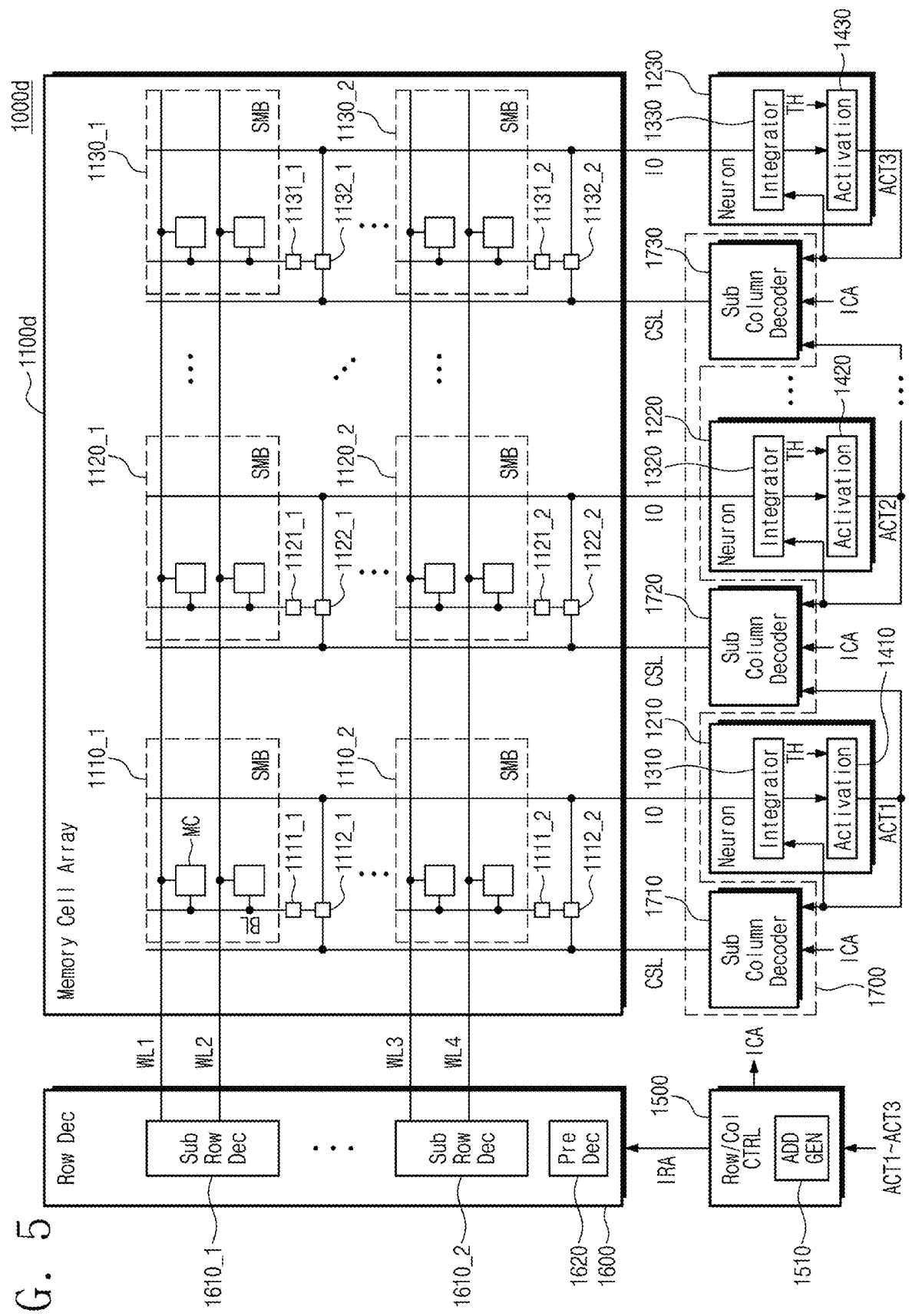
FIG. 5 illustrates a block diagram of a neuromorphic device according to another embodiment of the inventive concepts in detail.

FIG. 5 illustrates a block diagram of a neuromorphic device according to another embodiment of the inventive concepts in detail. Additional description associated with components having the same reference numerals will be omitted to avoid redundancy, and the differences between neuromorphic devices 1000c and 1000d will be mainly described.

The memory cell array 1100d may further include sub memory blocks 1120_1 to 1130_1. The sub memory blocks 1120_1 to 1130_1 may include memory cells MC connected to the word lines WL1 and WL2 that are selected by the sub row decoder 1610_1 and may be implemented to be identical to each other. The memory cell array 1100d may further include sub memory blocks 1120_2 to 1130_2. The sub memory blocks 1120_2 to 1130_2 may include memory cells MC connected to the word lines WL3 and WL4 that are selected by the sub row decoder 1610_2 and may be implemented to be identical to each other. The memory cell array 1100d may further include bit line sense amplifiers 1121_1 to 1121_2 and 1131_1 to 1131_2 substantially identical to the bit line sense amplifiers 1111_1 to 1111_2 and column selection switches 1122_1 to 1122_2 and 1132_1 to 1132_2 substantially identical to the column selection switches 1112_1 to 1112_2. The bit line sense amplifiers 1111_1 and 1131_1 and the column selection switches 1112_1 and 1132_1 may be disposed adjacent to the sub memory blocks 1110_1 to 1130_1. The bit line sense amplifiers 1111_2 and 1131_2 and the column selection switches 1112_2 and 1132_2 may be disposed adjacent to the sub memory blocks 1110_2 to 1130_2.

A sub word line driver array driving the word lines WL1 and WL2 and a sub memory block may be further disposed between the sub memory blocks 1110_1 to 1130_1. As in the above description, a sub word line driver array and a sub memory block may be further disposed between the sub memory blocks 1110_2 to 1130_2. A sub memory block, a bit line sense amplifier, and a column selection switch may be further disposed between the sub memory blocks 1110_1 and 1110_2, between the sub memory blocks 1120_1 and 1120_2, and between the sub memory blocks 1130_1 and 1130_2.

The neuromorphic device 1000d may further include neuron circuits 1220 to 1230, with neural circuit 1210 corresponding to the neural circuit 1200 of FIG. 4. The number of additional neuron circuits 1220 to 1230 may correspond to the number of sub memory blocks disposed along a direction in which the word lines WL1 to WL4 are extended. The neuron circuits 1210 to 1230 may respectively include integrators 1310 to 1330 and may respectively include activation circuits 1410 to 1430. The neuron circuits 1210 to 1230 may operate to be substantially identical to the neuron circuit 1200 and may output the activation signals ACT1 to ACT3, respectively. The neuron circuit 1210 may sum at least two or more of weights stored in the memory cells MC of the sub memory blocks 1110_1 to 1110_2 at an input/output line IO. As in the neuron circuit 1210, each of the neuron circuits 1220 and 1230 may sum two or more weights at an input/output line IO.

The column decoder 1700 may include additional sub column decoders 1720 to 1730, with sub column decoder 1710 corresponding to the sub column decoder 1700 of FIG. 4. Each of the sub column decoders 1710 to 1730 may decode the internal column address ICA and may transmit the column selection signal through the column selection line CSL. For example, the sub column decoder 1710 may select the memory cells MC of the sub memory blocks 1110_1 to 1110_2, the sub column decoder 1720 may select the memory cells MC of the sub memory blocks 1120_1 to 1120_2, and the sub column decoder 1730 may select the memory cells MC of the sub memory blocks 1130_1 to 1130_2.

In the case of "①" of FIG. 2 and/or FIG. 3, the row decoder 1600 may simultaneously select the word lines WL1 and WL3 and the memory cells MC of the sub memory blocks 1110_1 to 1130_2 connected to the word lines WL1 and WL3. In the case of "②" of FIG. 2 or FIG. 3, the row decoder 1600 may simultaneously select the word lines WL2 and WL4 and the memory cells MC of the sub memory blocks 1110_1 to 1130_2 connected to the word lines WL2 and WL4. The sub column decoders 1710 to 1730 may apply the column selection signals to the column selection switches 1112_1 to 1132_2 through the column selection lines CSL. The neuron circuit 1210 may simultaneously sum read signals from memory cells selected by the row decoder 1600 and the column decoder 1700 at the input/output line IO, the neuron circuit 1220 may simultaneously sum read signals from memory cells selected by the row decoder 1600 and the column decoder 1700 at the input/output line IO, the neuron circuit 1230 may simultaneously sum read signals from memory cells selected by the row decoder 1600 and the column decoder 1700 at the input/output line IO, and the neuron circuits 1210 to 1230 may output the activation signals ACT1 to ACT3, respectively. The neuron circuit 1210 may compare a sum signal of the integrator 1310 with the threshold signal TH to output the activation signal ACT1, the neuron circuit 1220 may compare a sum signal of the integrator 1320 with the threshold signal TH to output the activation signal ACT2, and the neuron circuit 1230 may compare a sum signal of the integrator 1330 with the threshold signal TH to output the activation signal ACT3. Therefore, all, a part, or none of the activation signals ACT1 to ACT3 may be enabled, or all, part, or none the activation signals ACT1 to ACT3 may be disabled.

In an embodiment, the neuron circuit 1210 may reset the row decoder 1600, the sub column decoder 1710, and/or the integrator 1310 by using the enabled activation signal ACT1. Because the sub column decoder 1710 selects the accessed memory cells MC through the input/output line IO connected to the neuron circuit 1210 and the integrator 1300 is included in the neuron circuit 1210, the reset operation described above may be a self-reset operation. The neuron circuit 1210 may reset the sub column decoder 1720 or the sub column decoder 1730, which is adjacent to the neuron circuit 1210. Each of the sub column decoders 1710 and 1720 may disable the column selection signal in response to the enabled activation signal ACT1. The sub column decoder 1720 may disable the column selection signal in response to the enabled activation signal ACT2. The integrator 1300 may drive a voltage level of the input/output line IO to a pre-charge level or a reset level in response to the enabled activation signal ACT1. As in the neuron circuit 1210, the neuron circuits 1220 and 1230 may each perform reset operations, respectively. For example, the row decoder 1600 may disable row selection signals transmitted through selected word lines in response to the enabled activation signal ACT1/ACT2/ACT3.

Figure 6:
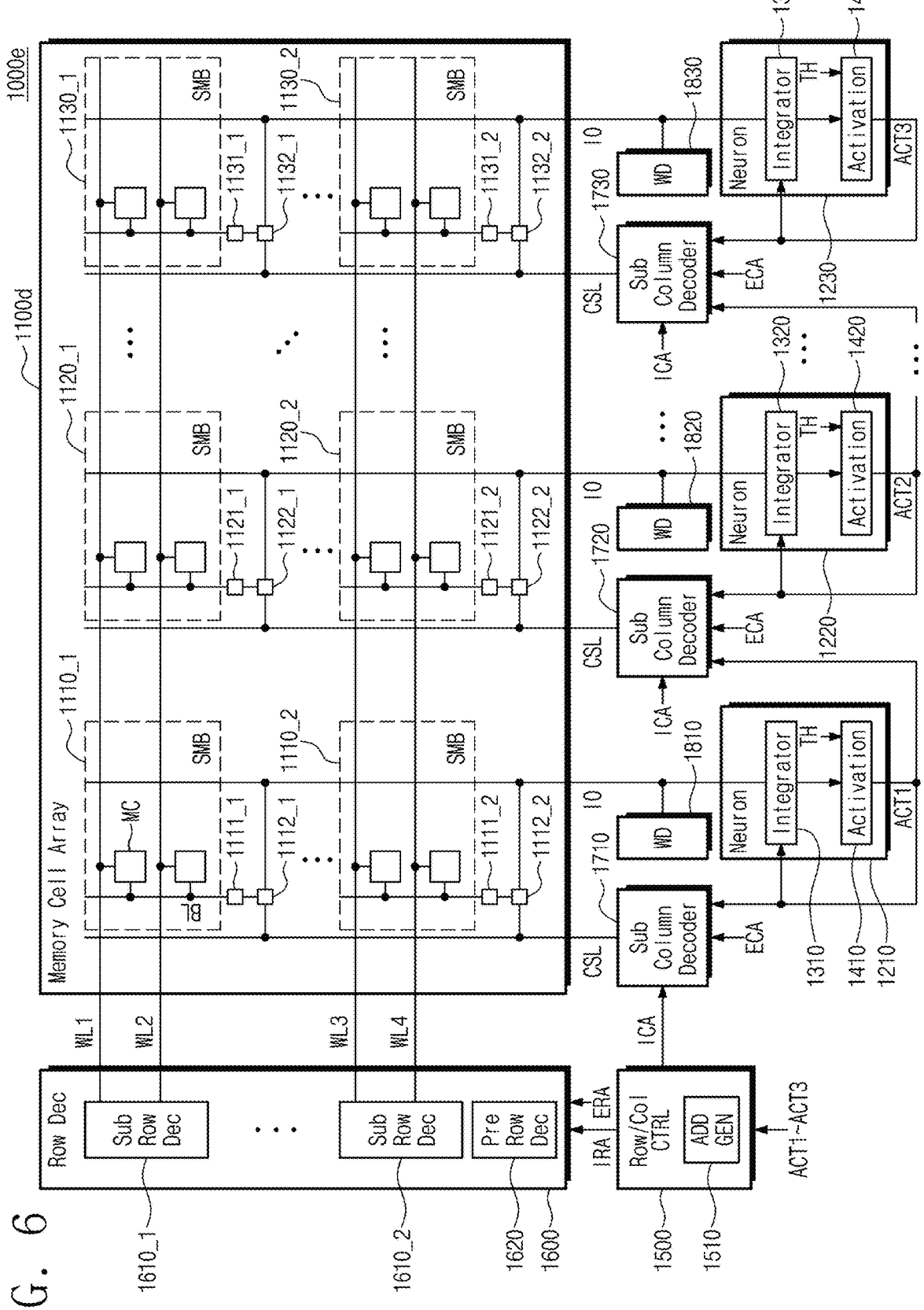
FIG. 6 illustrates a block diagram of a neuromorphic device according to another embodiment of the inventive concepts in detail.

FIG. 6 illustrates a block diagram of a neuromorphic device according to another embodiment of the inventive concepts in detail. Additional description associated with components having the same reference numerals will be omitted to avoid redundancy, and the differences between neuromorphic devices 1000d and 1000e will be mainly described.

Compared with the neuromorphic device 1000d, the neuromorphic device 1000e may further include write drivers 1810 to 1830. After memory cells are selected by the row decoder 1600 and the column decoder 1700 (refer to FIG. 5), the write driver 1810 may write and/or update weights in memory cells selected from memory cells of the sub memory blocks 1110_1 to 1110_2 through the input/output line IO, respectively. As in the write driver 1810, the write drivers 1820 and 1830 may perform write operations.

The row decoder 1600 may decode an external row address ERA and may select one of the word lines WL1 to WL4. The pre-row decoder 1620 may decode the external row address ERA and may select one of the sub row decoders 1610_1 to 1610_2. In the case of decoding the internal row address IRA, the pre-row decoder 1620 may set, to a Don't Care bit, an upper bit of a row address bit that is used to select word lines of each of the sub memory blocks 1110_1 and 1110_2. In the case of decoding the external row address ERA, the pre-row decoder 1620 may validly decode the upper bit. The row decoder 1600 may simultaneously select two or more word lines in the case where the neuromorphic device 1000e performs a neural network operation (e.g., a "neuromorphic computing operation" or "neuromorphic processing") by using weights and biases stored in the memory cell array 1100d. The row decoder 1600 may select one word line in the case where the neuromorphic device 1000e updates weights and biases stored in the memory cell array 1100. Each of the sub column decoders 1710 to 1730 may decode an external column address ECA to transmit the column selection signal through the column selection line CSL or may decode the internal column address ICA to transmit the column selection signal through the column selection line CSL.

For example, the external row address ERA and the external column address ECA may be transmitted and/or provided to the neuromorphic device 1000e for updating weights and biases stored in the memory cell array 1100. As the neuromorphic device 1000e performs the neural network operation, the internal row address IRA and the internal column address ICA may be internally generated by the address generator 1510 based on the activation signals ACT1 to ACT3 output from the neuron circuits 1210 to 1230.

Figure 7:
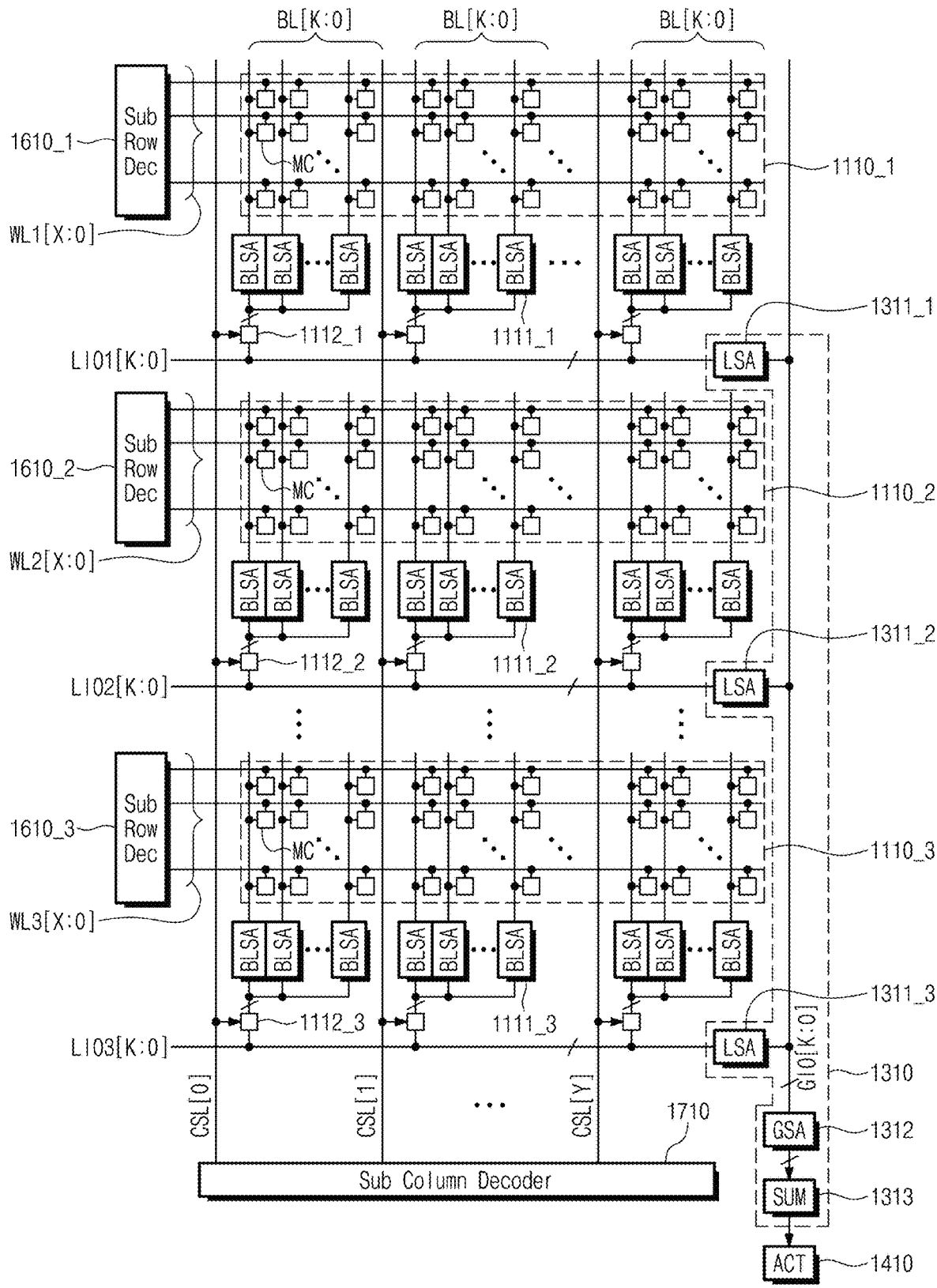
FIG. 7 illustrates a block diagram of a neuromorphic device of FIG. 5 in detail.

FIG. 7 illustrates a block diagram of a neuromorphic device of FIG. 5 in detail. Additional description associated with components having the same reference numerals will be omitted to avoid redundancy, and the neuromorphic device 1000d will be described with reference to FIGS. 5 and 7.

The example in FIG. 5 illustrates the sub row decoder 1610_1 as connected to the word lines WL1 and WL2, but an example is illustrated in FIG. 7, wherein the sub row decoder 1610_1 is connected to word lines WL1[X:0] (X being an integer of 1 or more), decodes the internal row address IRA to select one of the word lines WL1[X:0] (i.e., WL1 and WL2 belonging to WL1[X:0]), and outputs a row selection signal through the selected word line. The remaining sub row decoders 1610_2 and 1610_3 may be implemented to be substantially identical to the sub row decoder 1610_1. The example in FIG. 5 illustrates the sub column decoder 1710 as connected to the one column selection line CSL, but an example is illustrated in FIG. 7, wherein the sub column decoder 1710 is connected to column selection lines CSL[Y:0] (Y being an integer of 1 or more) (CSL belonging to CSL[Y:0]), decodes the internal column address ICA to select one of the column selection lines CSL[Y:0], and outputs a column selection signal through the selected column selection line. The remaining sub column decoders 1720 to 1730 (of FIG. 5) may be implemented to be substantially identical to the sub column decoder 1710. The sub memory block 1110_1 may include the memory cells MC corresponding to the word lines WL1[X:0] and bit lines BL[K:0] (K being an integer of 1 or more) simultaneously selected by column selection signals transmitted through the column selection lines CSL[Y:0]. Also, the bit line sense amplifiers 1111_1 respectively connected to the bit lines BL[K:0] may be disposed adjacent to the sub memory block 1110_1. The sub memory blocks 1110_2 to 1110_3 may be implemented to be substantially identical to the sub memory block 1110_1, and the bit line sense amplifiers 1111_2 to 1111_3 may be disposed adjacent to the sub memory blocks 1110_2 to 1110_3, respectively.

The memory cell array 1100 may include column selection switches 1112_1 to 1112_3. The column selection switches 1112_1 may electrically connect the bit lines BL[K:0] of the sub memory block 1110_1 to local input/output lines LIO1[K:0] in response to the column selection signal transmitted through a column selection line selected from the column selection lines CSL[Y:0], respectively. The column selection switches 1112_2 may electrically connect the bit lines BL[K:0] of the sub memory block 1110_2 to local input/output lines LIO2[K:0] in response to the column selection signal transmitted through a column selection line selected from the column selection lines CSL[Y:0], respectively. The column selection switches 1112_3 may electrically connect the bit lines BL[K:0] of the sub memory block 1110_3 to local input/output lines LIO3[K:0] in response to the column selection signal transmitted through a column selection line selected from the column selection lines CSL[Y:0], respectively.

For example, the sub row decoders 1610_1, 1610_2, and 1610_3 may respectively select the word lines WL1[0], WL2[0], and WL3[0], and the sub column decoder 1710 may select the column selection line CSL[0] (or course, only a part of the sub row decoders 1610_1, 1610_2, and 1610_3 may select word lines and one of the remaining column selection lines CSL[Y:1] may be selected). The bit line sense amplifiers 1111_1, 1111_2, and 1111_3 may sense voltage levels of the bit lines BL[K:0], which are changed by weights stored in memory cells connected to the word lines WL1[0], WL2[0], and WL3[0]. The column selection switches 1112_1, 1112_2, and 1112_3 connected to the column selection line CSL[0] may electrically connect the bit lines BL[K:0] to the local input/output lines LIO1[K:0], LIO2[K:0], and LIO3[K:0], respectively. That is, weights stored in the selected memory cells or read signals from the selected memory cells including the weights may be transferred to the local input/output lines LIO1[K:0], LIO2[K:0], and LIO3[K:0]. In addition, the bit line sense amplifiers 1111_1, 1111_2, and 1111_3 may amplify the sensed voltage levels of the bit line BL[K:0] and may restore weights stored in the memory cells connected to the word lines WL1[0], WL2[0], and WL3[0].

The integrator 1300 may include local sense amplifiers 1311_1 respectively connected to the local input/output lines LIO1[K:0], local sense amplifiers 1311_2 respectively connected to the local input/output lines LIO2[K:0], and local sense amplifiers 1311_3 respectively connected to the local input/output lines LIO3[K:0]. The local sense amplifiers 1311_1 may drive global input/output lines GIO[K:0] based on read signals transferred to the local input/output lines LIO1[K:0], that is, voltage levels of the local input/output lines LIO1[K:0]. The local sense amplifiers 1311_2 may drive the global input/output lines GIO[K:0] based on voltage levels of the local input/output lines LIO2[K:0]. The local sense amplifiers 1311_3 may drive the global input/output lines GIO[K:0] based on voltage levels of the local input/output lines LIO3[K:0]. As described above, when a neural network operation is performed, at least two or more of the sub row decoders 1610_1 to 1610_3 may simultaneously select word lines. Accordingly, at least two or more of the local sense amplifiers 1311_1 to 1311_3 may simultaneously drive the global input/output lines GIO[K:0]. For example, the local sense amplifiers 1311_1, 1311_2, and 1311_3 respectively connected to the local input/output lines LIO1[0], LIO2[0], and LIO3[0] may drive the global input/output lines GIO[0] simultaneously and respectively. As in the above description, the local sense amplifiers 1311_1, 1311_2, and 1311_3 respectively connected to the local input/output lines LIO1[0], LIO2[0], and LIO3[0] may drive the global input/output lines GIO[1] simultaneously and respectively. Local sense amplifiers and local input/output lines may be provided every sub memory blocks that are disposed in a word line direction. The input/output lines IO described with reference to FIGS. 2 to 6 may include the local input/output lines LIO1[K:0] to LIO3[K:0] and the global input/output lines GIO[K:0].

The integrator 1300 may include global sense amplifiers 1312 respectively connected to the global input/output lines GIO[K:0] and a sum circuit 1313. The global sense amplifiers 1312 may sense and amplify voltage levels of the global input/output lines GIO[K:0], respectively. The global sense amplifiers 1312 may sense and amplify weights or biases of selected memory cells, which are respectively summed at the global input/output lines GIO[K:0]. The global sense amplifiers 1312 may provide the sum circuit 1313 with the sensed voltage levels of the global input/output lines GIO[K:0]. The integrator 1300 may sum read signals including weights or biases of the memory cells MC at the global input/output lines GIO[K:0] by using the local sense amplifiers 1311_1 to 1311_3 and the global sense amplifiers 1312. The sum circuit 1313 may sum the voltage levels of the global input/output lines GIO[K:0] provided from the global sense amplifiers 1312, may generate a sum signal SOUT, and/or may provide the sum signal SOUT to the activation circuit 1400. Only the sub column decoder 1710 and the neuron circuit 1200 are described with reference to FIG. 7, but the remaining sub column decoders 1720 to 1730 and the remaining neuron circuits 1220 to 1230 of FIG. 5 may be implemented to be identical to the sub column decoder 1710 and the neuron circuit 1200.

Figure 8:
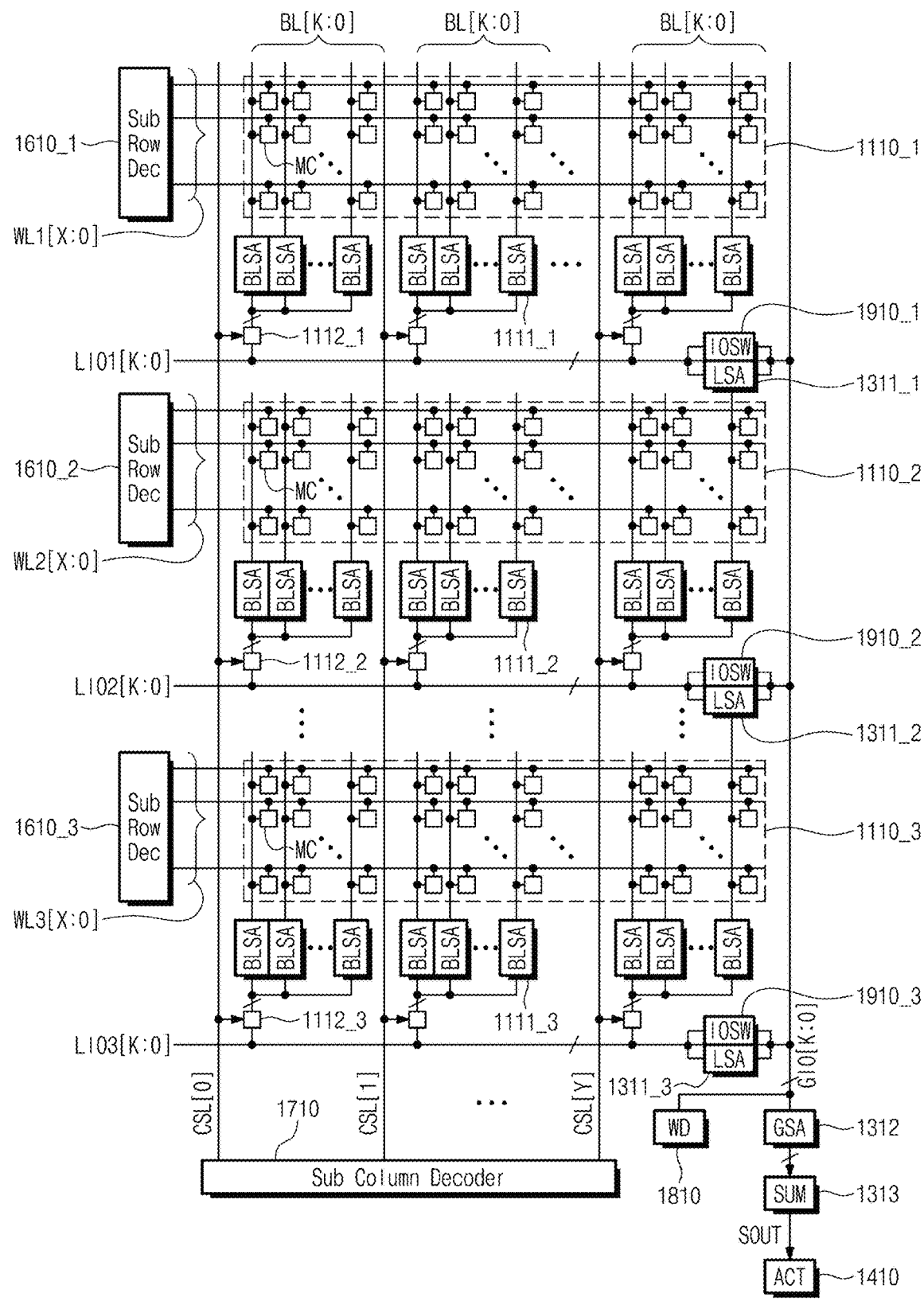
FIG. 8 illustrates a block diagram of a neuromorphic device of FIG. 6 in detail.

FIG. 8 illustrates a block diagram of a neuromorphic device of FIG. 6 in detail. Additional description associated with components having the same reference numerals will be omitted to avoid redundancy, a neuromorphic device 1000e will be described with reference to FIGS. 6 and 8, and a difference between the neuromorphic device 1000e and the neuromorphic device 1000d will be mainly described.

The memory cell array 1100 may include input/output switches 1910_1 electrically connecting the local input/output lines LIO1[K:0] to the global input/output lines GIO[K:0], respectively, input/output switches 1910_2 electrically connecting the local input/output lines LIO2[K:0] to the global input/output lines GIO[K:0], respectively, and input/output switches 1910_3 electrically connecting the local input/output lines LIO3[K:0] to the global input/output lines GIO[K:0], respectively. For example, to update weights and/or biases stored in the memory cell array 1100, the sub row decoder 1610_1 may select the word line WL1[0], and the sub column decoder 1710 may select the column selection line CSL[0]. The input/output switches 1910_1 may electrically connect the local input/output lines LIO1[K:0] to the global input/output lines GIO[K:0], respectively. Afterwards, the write driver 1810 may write new weights and/or new biases in memory cells selected by the sub row decoder 1610_1 and the sub column decoder 1710 through the global input/output lines GIO[K:0], the input/output switches 1910_1, the local input/output lines LIO1[K:0], the column selection switches 1112_1, and the bit lines BL[K:0]. The input/output switches 1910_1 to 1910_3 may transmit the new weights or the new biases to the memory cells MC. As in the above description, a write (or update) operation may be performed on the remaining memory cells.

Figure 9:
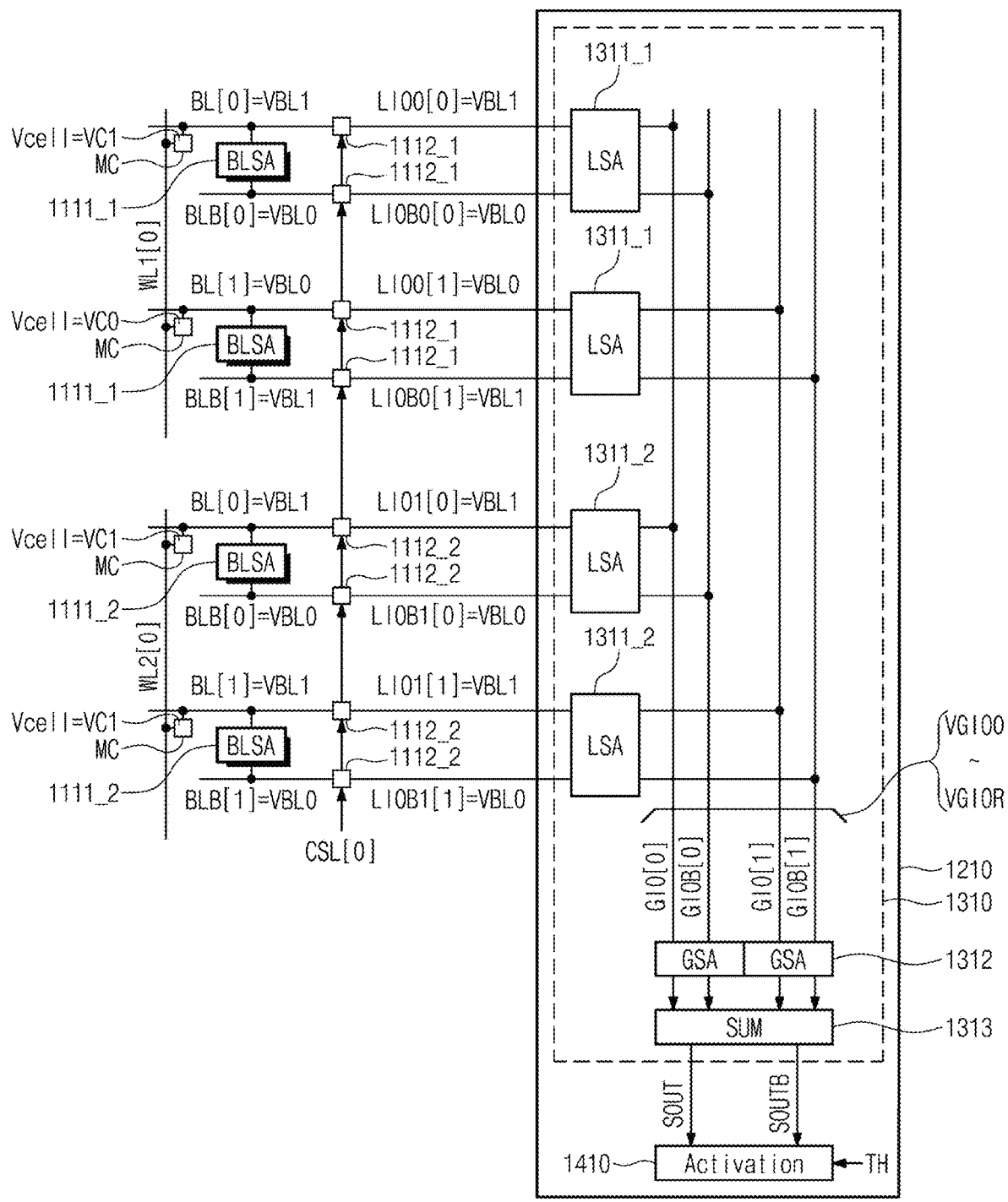
FIG. 9 illustrates a block diagram of a neuromorphic device of FIG. 7 in detail.

FIG. 9 illustrates a block diagram of a neuromorphic device of FIG. 7 in detail. Additional description associated with components having the same reference numerals will be omitted to avoid redundancy. Complementary bit lines BLB[K:0] of the bit lines BL[K:0], complementary local input/output lines LIOB1[K:0], LIOB2[K:0], and LIOB3[K:0] of the local input/output lines LIO1[K:0], LIO2[K:0], and LIO3[K:0], and complementary global input/output lines GIOB[K:0] of the global input/output lines GIO[K:0] may be further disposed in the memory cell array 1100 and the integrator 1300 of the neuromorphic device 1000d/1000e. One line and a complementary line may be a pair, the one line may be one of the lines BL[K:0], LIO1[K:0], LIO2[K:0], LIO3[K:0], and GIO[K:0], and the complementary line may be one of the lines BLB[K:0], LIOB1 [K:0], LIOB2 [K:0], LIOB3[K:0], and GIOB[K:0]. The complementary line may have a voltage level identical to a voltage level of the one line in a pre-charge mode and may have a voltage level complementary to a voltage level of the one line in the remaining modes (e.g., an activation mode, a read mode, and a write mode) other than the pre-charge mode. For example, the complementary line may be changed or driven in a direction that is opposite to a direction in which a voltage level of the one line is changed.

Referring to FIG. 9, the memory cells MC may be connected to the word lines WL1[0] and WL2[0]. For example, each of the memory cells MC may store a single bit. For example, the cell voltage level Vcell of the memory cell MC connected to the word line WL1[0] and the bit line BL[0] may be a voltage level VC1 corresponding to a first logic value, the cell voltage level Vcell of the memory cell MC connected to the word line WL1[0] and the bit line BL[1] may be a voltage level VC0 corresponding to a second logic value, the cell voltage level Vcell of the memory cell MC connected to the word line WL2[0] and the bit line BL[0] may be the voltage level VC1 corresponding to the first logic value, and the cell voltage level Vcell of the memory cell MC connected to the word line WL2[0] and the bit line BL[1] may be the voltage level VC1 corresponding to the first logic value. However, the voltage levels described above are only an example embodiment. When the word lines WL1[0] and WL2[0] are respectively selected by the sub row decoders 1610_1 and 1610_2, the charge sharing may occur between the memory cell MC and the bit line BL[0] and between the memory cell MC and the bit line BL[1].

The bit line sense amplifiers 1111_1 and 1111_2 may respectively sense and amplify a voltage level difference of the bit line BL[0] and the complementary bit line BLB[0] and a voltage level difference of the bit line BL[1] and the complementary bit line BLB[1]. Based on the sensed results, the bit line sense amplifiers 1111_1 may drive the bit line BL[0] and the complementary bit line BLB[0] with voltage levels VBL1 and VBL0 and may drive the bit line BL[1] and the complementary bit line BLB[1] with voltage levels VBL0 and VBL1. Based on the sensed results, the bit line sense amplifiers 1111_2 may drive the bit line BL[0] and the complementary bit line BLB [0] with voltage levels VBL1 and VBL0 and may drive the bit line BL[1] and the complementary bit line BLB[1] with voltage levels VBL1 and VBL0. However, the voltage levels VBL1 and VBL0 described above are only examples and may be changed depending on the cell voltage level Vcell.

For example, the bit line BL[0]/BL[1] and the complementary bit line BLB[0]/BLB[1] may be disposed together in the same sub memory block (a folded bit-line architecture). For another example, the bit line BL[0]/BL[1] and the complementary bit line BLB[0]/BLB[1] may be respectively disposed in different sub memory blocks (an open bit-line architecture).

The column selection switches 1112_1 and 1112_2 may electrically connect the bit line BL[0] to the local input/output line LIO[0], the complementary bit line BLB[0] to the complementary local input/output line LIOB[0], the bit line BL[1] to the local input/output line LIO[1], the complementary bit line BLB[1] to the complementary local input/output line LIOB[1], respectively. When the column selection switches 1112_1 are turned on by the column selection signal transmitted through the column selection line CSL[0], the bit line sense amplifiers 1111_1 may drive the local input/output line LIO0[0] and the complementary local input/output line LIOB0[0] with the voltage levels VBL1 and VBL0 and may drive the local input/output line LIO0[1] and the complementary local input/output line LIOB0[1] with the voltage levels VBL0 and VBL1. When the column selection switches 1112_2 are turned on by the column selection signal transmitted through the column selection line CSL[0], the bit line sense amplifiers 1111_2 may drive the local input/output line LIO1[0] and the complementary local input/output line LIOB1[0] with the voltage levels VBL1 and VBL0 and may drive the local input/output line LIO1[1] and the complementary local input/output line LIOB1[1] with the voltage levels VBL1 and VBL0.

The local sense amplifier 1311_1 connected to the local input/output line LIO0[0] and the complementary local input/output line LIOB0[0] may drive the global input/output line GIO[0] and the complementary global input/output line GIOB[0] based on the voltage levels VBL1 and VBL0. The local sense amplifier 1311_2 connected to the local input/output line LIO1[0] and the complementary local input/output line LIOB1[0] may drive the global input/output line GIO[0] and the complementary global input/output line GIOB[0] based on the voltage levels VBL1 and VBL0.

The local sense amplifier 1311_1 connected to the local input/output line LIO0[1] and the complementary local input/output line LIOB0[1] may drive the global input/output line GIO[1] and the complementary global input/output line GIOB[1] based on the voltage levels VBL0 and VBL1. The local sense amplifier 1311_2 connected to the local input/output line LIO1[1] and the complementary local input/output line LIOB1[1] may drive the global input/output line GIO[1] and the complementary global input/output line GIOB[1] based on the voltage levels VBL1 and VBL0.

For example, each of the voltage levels of the global input/output lines GIO[0] and GIO[1] and the complementary global input/output lines GIOB[0] and GIOB[1] may be one of voltage levels VGIO0 to VGIOR (R being an integer of 1 or more) corresponding to logic values of a sum of weights (or biases) stored in two memory cells MC. Weights and/or biases of the memory cells MC each having the cell voltage level Vcell (=VC1) may be summed at the global input/output line GIO[0] and the complementary global input/output line GIOB[0]. Weights or biases of the memory cell MC having the cell voltage level Vcell (=VC0) and the memory cell MC having the cell voltage level Vcell (=VC1) may be summed at the global input/output line GIO[1] and the complementary global input/output line GIOB[1]. Accordingly, the voltage levels of the global input/output lines GIO[0] and GIO[1] may be different from each other, and the voltage levels of the complementary global input/output lines GIOB[0] and GIOB[1] may be different from each other.

The description is given with reference to FIG. 9 as 1-bit weights (or biases) of two memory cells MC are summed at the global input/output line GIO[0]/GIO[1] and the complementary global input/output line GIOB[0]/GIOB[1]. However, the number of logic values and the number of voltage levels VGIO0 to VGIOR may further increase depending on the number of weights (or biases) summed at the global input/output line GIO[0]/GIO[1] and the complementary global input/output line GIOB[0]/GIOB[1] or the number of bits of biases (or weights) summed at the global input/output line GIO[0]/GIO[1] and the complementary global input/output line GIOB[0]/GIOB[1].

The global sense amplifier 1312 may be connected to the global input/output line GIO[0] and the complementary global input/output line GIOB[0] and may sense and amplify voltage levels of the global input/output line GIO[0] and the complementary global input/output line GIOB[0]. The global sense amplifier 1312 may be connected to the global input/output line GIO[1] and the complementary global input/output line GIOB[1] and may sense and amplify voltage levels of the global input/output line GIO[1] and the complementary global input/output line GIOB[1]. The sum circuit 1313 may sum the voltage levels of the global input/output lines GIO[1:0] and the voltage levels of the complementary global input/output lines GIOB[1:0] provided from the global sense amplifiers 1312, may generate the sum signal SOUT and a complementary sum signal SOUTB, and may provide the sum signal SOUT and the complementary sum signal SOUTB to the activation circuit 1400.

Figure 10:
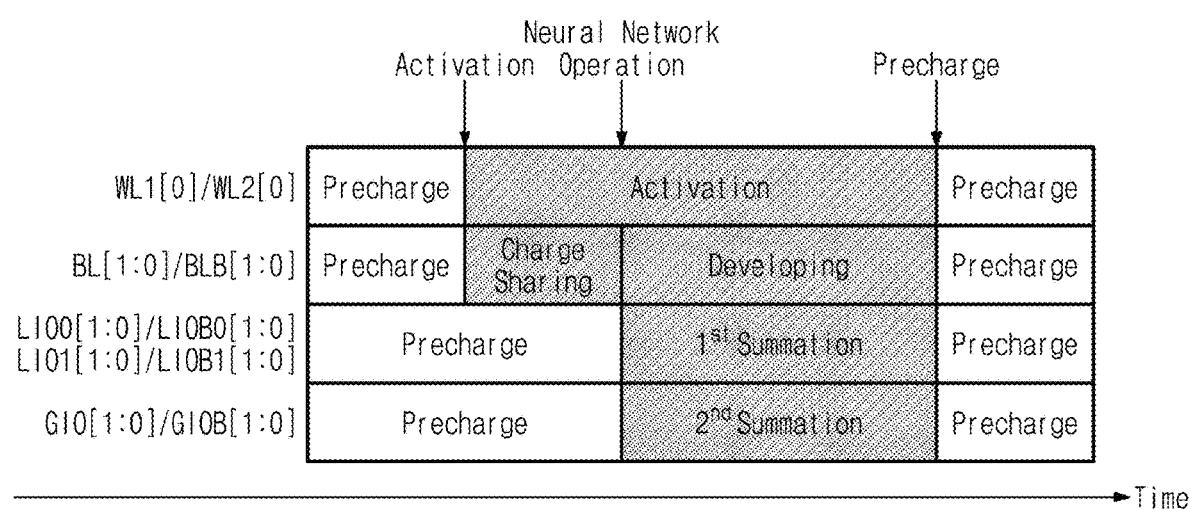
FIG. 10 illustrates a timing diagram of an operation of a neuromorphic device of FIG. 9.

FIG. 10 illustrates a timing diagram of an operation of a neuromorphic device of FIG. 9. At the beginning of operation, voltage levels of lines WL1[0], WL2[0], BL[1:0], BLB[1:0], LIO0[1:0], LIOB0[1:0], LIO1[1:0], LIOB1[1:0], GIO[1:0], and GIOB[1:0] illustrated in FIG. 9 may be pre-charge levels of a pre-charge mode.

Under control of the row/column controller 1500, the sub row decoders 1610_1 and 1610_2 may select the word lines WL1[0] and WL2[0] corresponding to the internal row address IRA in the activation mode. When the word lines WL1[0] and WL2[0] are selected, the charge sharing may occur between the bit lines BL[1:0] and the memory cells MC. An example is illustrated in FIG. 9 as the bit lines BL[1:0] are directly connected to the memory cells MC. However, because the complementary bit lines BLB[1:0] may also be connected to any other memory cells, the charge sharing may occur between the complementary bit lines BLB[1:0] and the other memory cells.

When the charge sharing between the bit lines BL[1:0] and the memory cells MC are completed, the neural network operation of the neuromorphic device 1000d may be initiated. After the charge sharing, the bit line sense amplifiers 1111_1 and 1111_2 may respectively sense and amplify a voltage level difference of the bit line BL[0] and the complementary bit line BLB[0] and a voltage level difference of the bit line BL[1] and the complementary bit line BLB[1]. The bit lines BL[1:0] and the complementary bit lines BLB[1:0] may be developed or amplified to voltage levels corresponding to logic values that the cell voltage levels Vcell of the memory cells MC indicate. Also, as the neural network operation of the neuromorphic device 1000d is initiated, the sub column decoder 1710 may enable or select the column selection line CSL[0] corresponding to the internal column address ICA under control of the row/column controller 1500. When the sub column decoder 1710 turns on the column selection switches 1112_1 and 1112_2 by using the column selection signal transferred through the column selection line CSL[0], the local input/output lines LIO0[1:0] and LIO1[1:0] and the complementary local input/output lines LIOB0[1:0] and LIOB1[1:0] may have voltage levels of the bit lines BL[1:0] and the complementary bit lines BLB[1:0], and the local sense amplifiers 1311_1 and 1311_2 may drive the global input/output lines GIO[1:0] and the complementary global input/output lines GIOB[1:0] based on the voltage levels of the local input/output lines LIO0[1:0] and LIO1[1:0] and the complementary local input/output lines LIOB0[1:0] and LIOB1[1:0] (i.e., first summation).

After the first summation, the sum circuit 1313 may sum the voltage levels of the global input/output lines GIO[K:0] and the voltage levels of the complementary global input/output lines GIOB[K:0] (i.e., second summation). After the second summation, under control of the row/column controller 1500 and/or based on an activation signal of the activation circuit 1400, the sub row decoders 1610_1 and 1610_2 and the sub column decoders 1710_1 may drive voltage levels of the lines WL1 [0], WL2[0], BL[1:0], BLB [1:0], LIO0[1:0], LIOB0[1:0], LIO1 [1:0], LIOB1 [1:0], GIO [1:0], and GIOB [1:0] to the pre-charge levels of the pre-charge mode. As the timing diagram of FIG. 10 is repeated, the neural network operation of the neuromorphic device 1000d may be executed.

Figure 11:
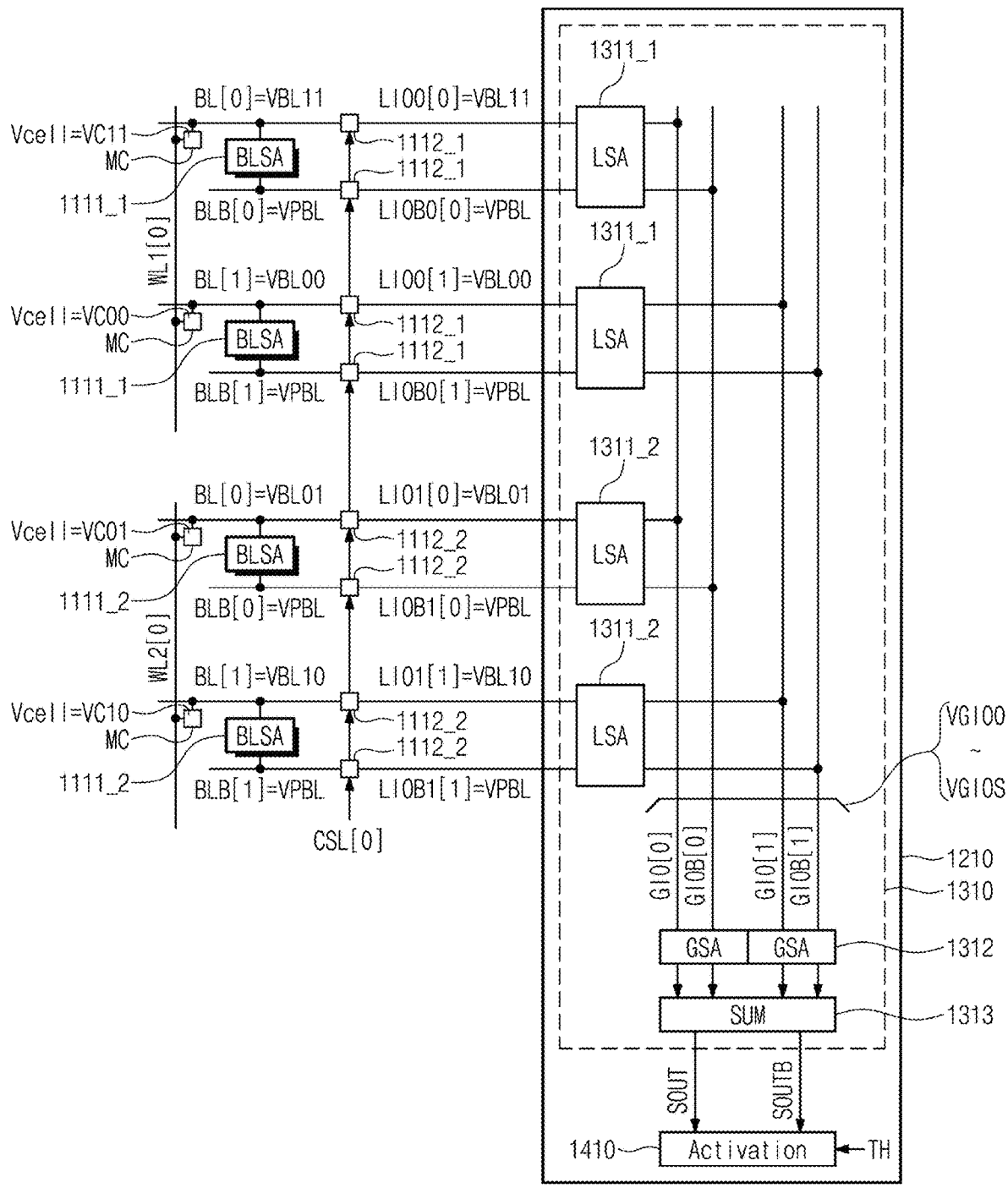
FIG. 11 illustrates a block diagram of a neuromorphic device of FIG. 7 in detail.

FIG. 11 illustrates a block diagram of a neuromorphic device of FIG. 7 in detail. A description will be focused on the differences between the neuromorphic device 1000d of FIG. 11 and the neuromorphic device 1000d of FIG. 9. Unlike the memory cells MC of FIG. 9, each of the memory cells MC of FIG. 11 may store two bits. For example, the cell voltage level Vcell of the memory cell MC connected to the word line WL1[0] and the bit line BL[0] may be a voltage level VC11 corresponding to a first logic value, the cell voltage level Vcell of the memory cell MC connected to the word line WL1[0] and the bit line BL[1] may be a voltage level VC00 corresponding to a second logic value, the cell voltage level Vcell of the memory cell MC connected to the word line WL2[0] and the bit line BL[0] may be the voltage level VC01 corresponding to a third logic value, and the cell voltage level Vcell of the memory cell MC connected to the word line WL2[0] and the bit line BL[1] may be the voltage level VC10 corresponding to a fourth logic value. However, the voltage levels described above are only examples. As described above, the memory cells MC may store two or more bits, and the number of logic values and the number of cell voltage levels may further increase depending on two or more bits. However, for convenience of illustration and description, it is assumed that each of the memory cells MC stores two bits.

When the word lines WL1[0] and WL2[0] are respectively selected by the sub row decoders 1610_1 and 1610_2, the charge sharing may occur between the memory cell MC and the bit lines BL[1:0]. The bit lines BL[1:0] intersecting the word line WL1[0] may have voltage levels VBL00 and VBL11 by the charge sharing. The bit lines BL[1:0] intersecting the word line WL2[0] may have voltage levels VBL10 and VBL01 by the charge sharing. When the column selection switches 1112_1 and 1112_2 are turned on by the column selection signal transmitted through the column selection line CSL[0], the local input/output lines LIO0[1:0] may have the same voltage levels VBL00 and VBL11 as the bit lines BL[1:0] intersecting the word line WL1[0], and the local input/output lines LIO1[1:0] may have the same voltage levels VBL10 and VBL01 as the bit lines BL[1:0] intersecting the word line WL2[0]. Each of the complementary bit lines BLB[1:0] and the complementary local input/output lines LIOB0[1:0] and LIOB1[1:0] may have a pre-charge level VPBL. With regard to the memory cells MC having the cell voltage levels Vcell (=VC11, VC00, VC01, and VC10), respective voltage level differences of the bit lines BL[0], BL[1], BL[0], and BL[1] and the complementary bit lines BLB[0], BLB[1], BLB[0], and BLB[1] and respective voltage level differences between the local input/output lines LIO0[0], LIO0[1], LIO1[0], and LIO1[1] and the complementary local input/output lines LIOB0[0], LIOB0[1], LIOB1[0], and LIOB1[1] may indicate logic values respectively corresponding to the cell voltage levels Vcell (VC11, VC00, VC01, and/or VC10). The voltage level differences described above may be formed by the charge sharing between the memory cells MC and the bit lines BL[0], BL[1], BL[0], and BL[1] or by the bit line sense amplifiers 1111_1 and 1111_2. For example, the bit line sense amplifiers 1111_1 and 1111_2 may maintain respective voltage level differences between the bit lines BL[1:0] and the complementary bit lines BLB[1:0] while the neural network operation is performed.

The local sense amplifiers 1311_1 and 1311_2 may drive the global input/output line GIO[0] and the complementary global input/output line GIOB[0] based on voltage levels VBL11, VPBL, VBL01, and VPBL of the local input/output lines LIO0[0], the complementary local input/output lines LIOB0[0], the local input/output line LIO1[0], and the complementary local input/output line LIOB1[0]. The local sense amplifiers 1311_1 and 1311_2 may drive the global input/output line GIO[1] and the complementary global input/output line GIOB[1] based on the voltage levels VBL00, VPBL, VBL10, and VPBL of the local input/output lines LIO0[1], the complementary local input/output lines LIOB0[1], the local input/output line LIO1[1], and the complementary local input/output line LIOB1[1].

For example, each of the voltage levels of the global input/output lines GIO[0] and GIO[1] and the complementary global input/output lines GIOB[0] and GIOB[1] may be one of voltage levels VGIO0 to VGIOS (S being an integer of 1 or more) corresponding to logic values of a sum of weights (or biases) stored in two memory cells MC. Weights and/or biases of the memory cells MC having the cell voltage level Vcell (=VC11) and the cell voltage level Vcell (=VC01) may be summed at the global input/output line GIO[0] and the complementary global input/output line GIOB[0]. Weights and/or biases of the memory cells MC having the cell voltage level Vcell (=VC00) and the cell voltage level Vcell (=VC10) may be summed at the global input/output line GIO[1] and the complementary global input/output line GIOB[1]. A voltage level difference of the global input/output line GIO[0] and the complementary global input/output line GIOB [0] may indicate a sum of weights or biases of the memory cells MC having the cell voltage level Vcell (=VC11) and the cell voltage level Vcell (=VC01). A voltage level difference of the global input/output line GIO[1] and the complementary global input/output line GIOB[1] may indicate a sum of weights or biases of the memory cells MC having the cell voltage level Vcell (=VC00) and the cell voltage level Vcell (=VC10).

The description is given with reference to FIG. 11 as 2-bit weights (and/or biases) of two memory cells MC are summed at the global input/output line GIO[0]/GIO[1] and the complementary global input/output line GIOB[0]/GIOB [1]. However, the number of logic values and the number of voltage levels VGIO0 to VGIOS may further increase depending on the number of weights (and/or biases) summed at the global input/output line GIO[0]/GIO[1] and the complementary global input/output line GIOB [0]/GIOB [1] or the number of biases (and/or weights) summed at the global input/output line GIO[0]/GIO[1] and the complementary global input/output line GIOB[0]/GIOB[1]. For example, "S" may be greater than "R."

Figure 12:
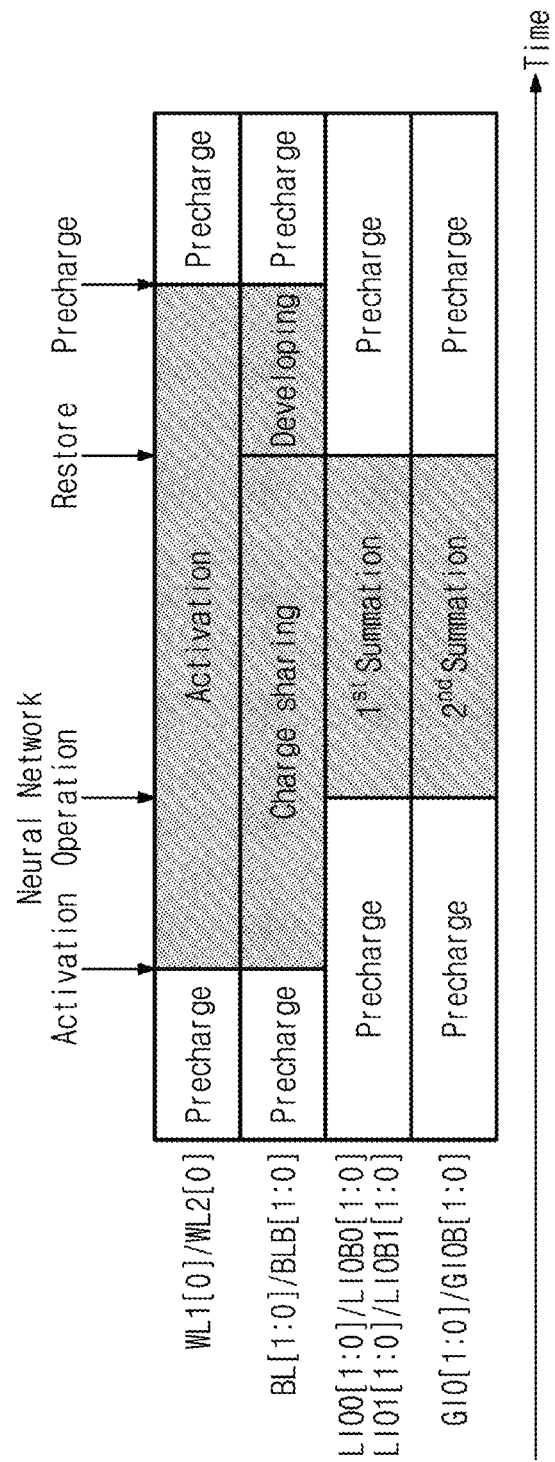
FIG. 12 illustrates a timing diagram of an operation of a neuromorphic device of FIG. 11.

FIG. 12 illustrates a timing diagram of an operation of a neuromorphic device of FIG. 11. A difference between the timing diagram FIG. 12 and the timing diagram of FIG. 10 will be mainly described.

After the charge sharing between the bit lines BL[1:0] and the memory cells MC are initiated, the neural network operation of the neuromorphic device 1000d may be initiated. Respective voltage level differences between the bit lines BL[1:0] and the complementary bit lines BLB[1:0] formed by the charge sharing may correspond to logic values that the cell voltage levels Vcell of the memory cells MC indicate. When the sub column decoder 1710 turns on the column selection switches 1112_1 and 1112_2 by using the column selection signal transmitted through the column selection line CSL[0], the local input/output lines LIO0[1:0] and LIO1[1:0] and the complementary local input/output lines LIOB0[1:0] and LIOB1[1:0] may have voltage levels of the bit lines BL[1:0] and the complementary bit lines BLB[1:0], and the local sense amplifiers 1311_1 and 1311_2 may drive the global input/output lines GIO[1:0] and the complementary global input/output lines GIOB[1:0] based on the voltage levels of the local input/output lines LIO0[1:0] and LIO1[1:0] and the complementary local input/output lines LIOB0[1:0] and LIOB1[1:0] (e.g., first summation). After the first summation, the sum circuit 1313 may sum the voltage levels of the global input/output lines GIO[K:0] and the voltage levels of the complementary global input/output lines GIOB[K:0] (e.g., second summation).

After the second summation and before the pre-charge mode, the bit line sense amplifiers 1111_1 and 1111_2 may amplify and/or develop respective voltage level differences between the bit lines BL[1:0] and the complementary bit lines BLB[1:0]. The cell voltage levels Vcell that have been stored in the memory cells MC may be restored by the develop operations of the bit line sense amplifiers 1111_1 and 1111_2. After the restore operation, under control of the row/column controller 1500, the sub row decoders 1610_1 and 1610_2 and the sub column decoders 1710_1 may drive voltage levels of the lines WL1[0], WL2[0], BL[1:0], BLB [1:0], LIO0[1:0], LIOB0[1:0], LIO1[1:0], LIOB1[1:0], GIO [1:0], and GIOB [1:0] to the pre-charge levels of the pre-charge mode. As the timing diagram of FIG. 12 is repeated, the neural network operation of the neuromorphic device 1000d may be executed.

Figure 13:
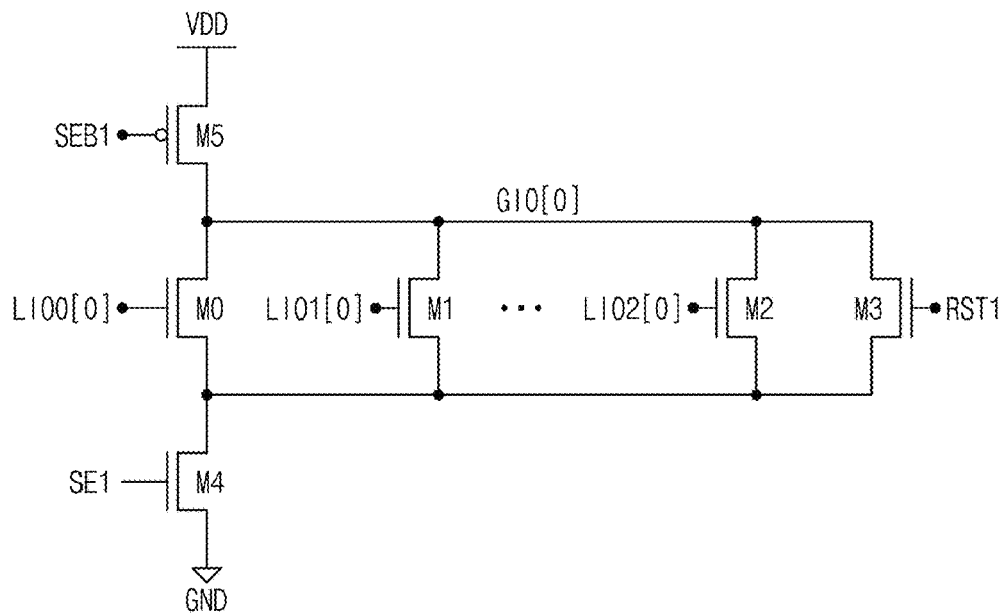
FIG. 13 illustrates a circuit diagram of an integrator according to an embodiment of the inventive concepts.

FIG. 13 illustrates a circuit diagram of an integrator according to an embodiment of the inventive concepts. FIG. 13 will be described with reference to FIG. 8. The integrator 1310 may include transistors M0 to M5. The transistors M0 to M2 may respectively and simultaneously drive the global input/output line GIO[0] depending on voltage levels of the local input/output lines LIO0[0] to LIO2[0]. For example, the transistors M0 to M2 may be respectively placed at the local sense amplifiers 1311_1 to 1311_3. The transistor M3 may reset and/or pre-charge the global input/output line GIO[0] depending on a reset signal RST1. The reset signal RST1 may be the activation signal ACTa/ACTb of the activation circuit 1400 or may be a signal that is generated based on the activation signal ACTa/ACTb. Based on a selection signal SE1 and a complementary selection signal SEB1, the transistors M4 and M5 connected to power supply voltages VDD and GND may select or may not select the global input/output line GIO[0]. For example, the selection signal SE1 and the complementary selection signal SEB1 may be generated by the sub column decoder 1710 decoding the internal column address ICA or the external column address ECA. For example, the transistors M3 to M5 may be placed at the global sense amplifier 1312. The integrator 1310 may further include transistors connected to the global input/output lines GIO[K:1], the complementary global input/output lines GIOB [K:0], the local input/output lines LIO1[K:1] to LIO3[K:1], and the complementary local input/output lines LIOB1[K:0] to LIOB3[K:0], transistors connected to the reset signal RST1, transistors connected to the select signal SE1 and the complementary selection signal SEB1, which are connected to be similar to the connection illustrated in FIG. 13. In FIG. 13, a type of transistors, a connection relationship of the transistors, and power supply voltages all are only examples, and may be adjusted accordingly.

Figure 14:
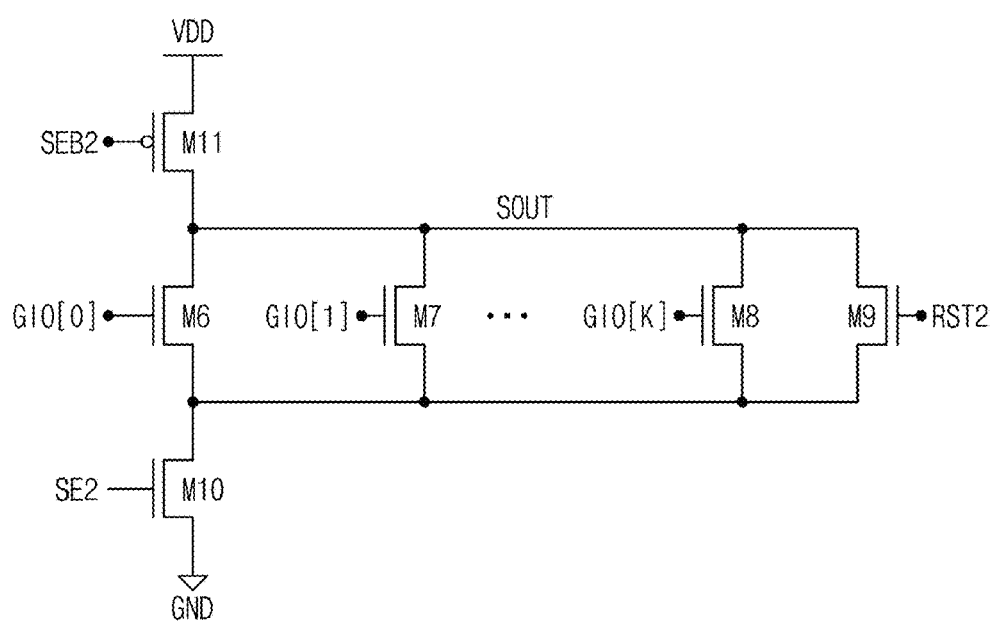
FIG. 14 illustrates a circuit diagram of a sum circuit according to an embodiment of the inventive concepts.

FIG. 14 illustrates a circuit diagram of a sum circuit according to an embodiment of the inventive concepts. FIG. 14 will be described with reference to FIG. 8. The sum circuit 1313 may include transistors M6 to M11. The transistors M6 to M8 may respectively and simultaneously drive an output line depending on voltage levels of the global input/output lines GIO[K:0] provided from the global sense amplifiers 1312 such that the sum signal SOUT is generated. The transistor M9 may reset or pre-charge the output line depending on a reset signal RST2. For example, the reset signal RST2 may be substantially identical to the reset signal RST1. Based on a selection signal SE2 and a complementary selection signal SEB2, the transistors M10 and M11 connected to the power supply voltages VDD and GND may select or may not select the output line. For example, the selection signal SE2 and the complementary selection signal SEB2 may be substantially identical to the selection signal SE1 and the complementary selection signal SEB1. The sum circuit 1313 may further include transistors respectively and simultaneously driving a complementary output line depending on voltage levels of the complementary global input/output lines GIOB[K:0], a transistor connected to the reset signal RST2, and transistors connected to the selection signal SE2 and the complementary selection signal SEB2, which are connected to be similar to the connection illustrated in FIG. 14. In FIG. 14, the type of transistors, the connection relationship of the transistors, and the power supply voltages all are only examples, and may be adjusted accordingly.

Figure 15:
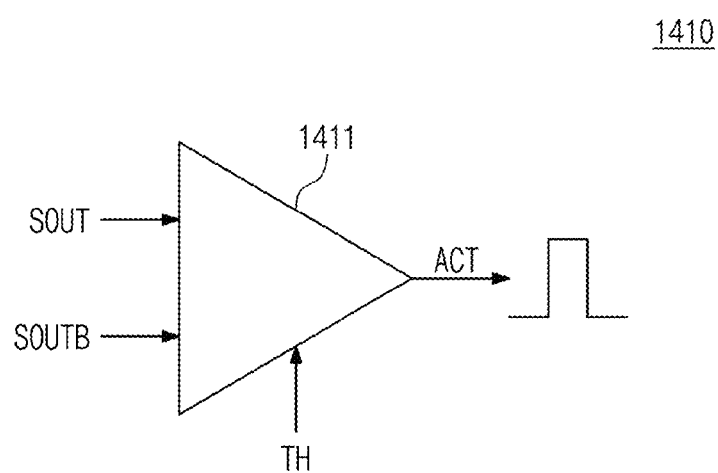
FIG. 15 illustrates a circuit diagram of an activation circuit according to an embodiment of the inventive concepts.

FIG. 15 illustrates a circuit diagram of an activation circuit according to an embodiment of the inventive concept. The activation circuit 1400 may include a comparator 1411 that compares the signals SOUT and SOUTB with the threshold signal TH. For example, when the sum signal SOUT exceeds the threshold signal TH and the complementary sum signal SOUTB does not exceed the threshold signal TH, the comparator 1411 may enable the activation signal ACT and may then disable the activation signal ACT. A period where the activation signal ACT is enabled may be decided in advance. Alternatively, when the sum signal SOUT does not exceed the threshold signal TH and the complementary sum signal SOUTB exceeds the threshold signal TH, the comparator 1411 may disable the activation signal ACT. For example, the activation signal ACT may be a pulse signal that is selectively output depending on a comparison result.

Figure 16:
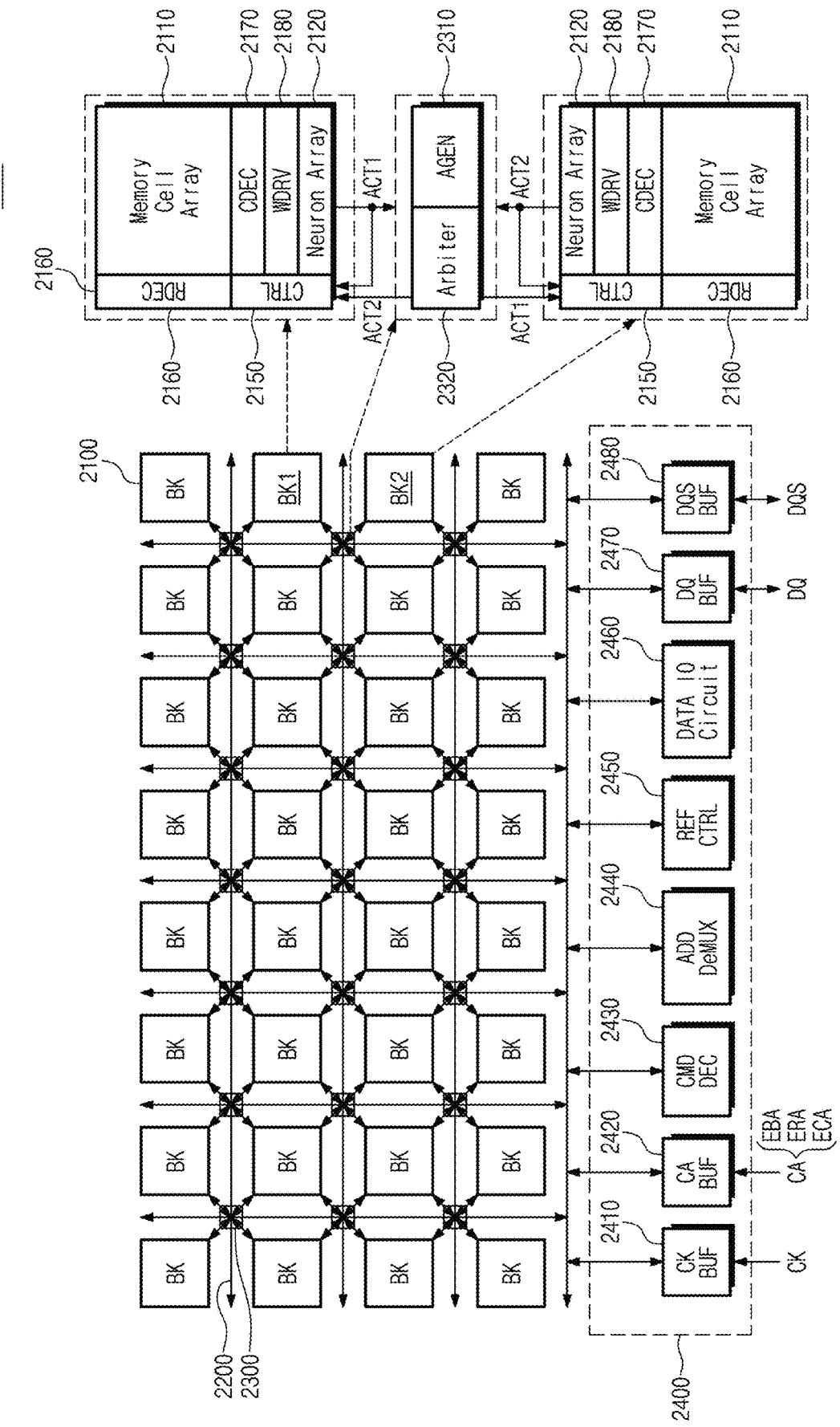
FIG. 16 illustrates a block diagram of a neuromorphic device according to an embodiment of the inventive concepts.

FIG. 16 illustrates a block diagram of a neuromorphic device according to an embodiment of the inventive concept. A neuromorphic device 2000 may include banks 2100, a bus 2200, a programmable router 2300, and a peripheral circuit 2400.

The bank 2100 may include a memory cell array 2110, a neuron circuit array 2120, a row/column controller 2150, a row decoder 2160, a column decoder 2170, and a write driver array 2180. The components 2110, 2150, 2160, and 2170 may be substantially identical to the components 1100, 1500, 1600, and 1700 described with reference to FIGS. 2 to 15. The neuron circuit array 2120 may include the neuron circuits 1200 and 1210 to 1230 described with reference to FIGS. 2 to 15. The write driver array 2180 may include the write drivers 1810 to 1830 described with reference to FIGS. 2 to 15.

The bus 2200 may provide an interconnection path between the banks 2100, an interconnection path between programmable routers 2300, an interconnection path between the peripheral circuit 2400 and the banks 2100, or an interconnection path between the peripheral circuit 2400 and the programmable routers 2300. For example, in the case where weights or biases stored in the memory cell array 2110 are updated, an address (including an external bank address, an external row address, and/or an external column address) indicating memory cells where previous weights or previous biases are stored, new weights, and new biases may be transmitted to the banks through the bus 2200. For another example, in the case where the neuromorphic device 2000 performs a neural network operation, activation signals of the neuron circuit array 2120 of a first bank 2100 may be transmitted to a second bank 2100 (e.g., a target bank). In this case, the row/column controller 2150 of the second bank 2100 may generate an internal address (e.g., an internal row address and an internal column address) for selecting memory cells of the memory cell array 2110 based on the transmitted activation signals.

The programmable router 2300 may receive the activation signals of the neuron circuit array 2120 of the first bank 2100 through the bus 2200, may generate an internal bank address corresponding to the second bank 2100 based on the received activation signals, and may transmit the received activation signals to the second bank 2100. Here, the internal bank address may indicate the memory cell array 2110 of the corresponding bank 2100. The programmable router 2300 may include a bank address generator 2310 that generates a plurality of internal bank addresses corresponding to a plurality of different banks 2100 based on the received activation signals and an arbiter 2320 that transmits the received activation signals to the plurality of different banks 2100 based on the plurality of internal bank addresses, respectively.

In detail, the bank address generator 2310 may receive the activation signals ACT1 of the neuron circuit array 2120 of a first bank BK1 and may generate internal bank addresses indicating a second bank BK2 based on the activation signals ACT1. The arbiter 2320 may transmit the activation signals ACT1 to the row/column controller 2150 of the second bank BK2 based on the internal bank addresses of the bank address generator 2310. The bank address generator 2310 may receive the activation signals ACT2 of the neuron circuit array 2120 of the second bank BK2 and may generate internal bank addresses indicating the first bank BK1 based on the activation signals ACT2. The arbiter 2320 may transmit the activation signals ACT2 to the row/column controller 2150 of the first bank BK1 based on the internal bank addresses of the bank address generator 2310. As described above, the activation signals ACT1 of the neuron circuit array 2120 of the first bank BK1 may be provided to the row/column controller 2150 of the first bank BK1, and the activation signals ACT2 of the neuron circuit array 2120 of the second bank BK2 may be provided to the row/column controller 2150 of the first bank BK1. The row/column controller 2150 of the first bank BK1 may generate the internal row address IRA and the internal column address ICA based on the activation signals ACT1 or the activation signals ACT2. The row/column controller 2150 of the first bank BK1 may generate the internal row address IRA and the internal column address ICA based on the activation signals ACT1 or the activation signals ACT2. An example is illustrated as the first bank BK1 and the second bank BK2 are adjacent to each other, but the first bank BK1 and the second bank BK2 may not be adjacent.

The programmable router 2300 may dynamically adjust the number of banks 2100 of the neuromorphic device 2000 based on the received activation signals. In the case where the neuromorphic device 2000 performs the neural network operation, the neuron circuit array 2120 may form the layers IL, HL, and OL of FIG. 1 as the neuron circuit array 2120 in one bank 2100 is reused, and the neuron circuit arrays 2120 may form the layers IL, HL, and OL of FIG. 1 as the neuron circuit arrays 2120 between a plurality of banks 2100 are reused. The arbiter 2320 of the programmable router 2300 may arbitrate the communication between the banks 2100 connected to the bus 2200, any other programmable routers 2300, and the peripheral circuit 2400. For example, weights stored in the memory cell array 2110 of a first bank 2100 may indicate connection strengths of the neuron circuit array 2120 that is reused in the first bank 2100. For another example, weights stored in the memory cell array 2110 of the first bank 2100 may indicate the connection strength of the neuron circuit array 2120 of the first bank 2100 and the neuron circuit array 2120 of the second bank 2100.

The peripheral circuit 2400 may include a clock buffer 2410, a command and address buffer 2420, a command decoder 2430, an address demultiplexer 2440, a refresh controller 2450, a data input/output circuit 2460, a DQ buffer 2470, and a DQS buffer 2480. The clock buffer 2410 may receive a clock signal CK from the outside and may provide the clock signal ICK to any other components of the peripheral circuit 2400. The command and address buffer 2420 may receive a command and address signal CA based on the clock signal CK received by the clock buffer 2410. The command and address signal CA may include the external bank address EBA, the external row address ERA, and the external column address ECA. Also, the command and address signal CA may further include various commands for the memory cell array 2110, such as an activation command, a read command, a write command, and a precharge command. The neuromorphic device 2000 may operate in synchronization with the clock signal CK. The command and address buffer 2420 may provide the command to the command decoder 2430 and the address to the address demultiplexer 2440. The command decoder 2430 may decode the command and may control the components 2100, 2200, 2300, 2410, 2420, and 2440 to 2480 of the neuromorphic device 2000 based on a decoding result. The address demultiplexer 2440 may receive an address and may provide the received address to the banks 2100 through the bus 2200 or the programmable router 2300 as the external row address ERA or the external column address ECA. The address demultiplexer 2440 may provide the external row address ERA or the external column address ECA to the bank 2100 that the external bank address EBA indicates.

The refresh controller 2450 may perform a refresh operation of restoring weights or biases stored in the memory cell array 2110. For example, the refresh controller 2450 may generate a refresh row address of word lines connected to memory cells in which weights or biases targeted for restoration are stored and a refresh bank address of the bank 2100 where memory cells are placed. The refresh controller 2450 may select the banks 2100 depending on the refresh bank address and may transmit the refresh row address to the row decoders 2160 of the banks 2100 through the bus 2200 or the programmable router 2300. The row decoder 2160 may select memory cells corresponding to the refresh row address, and bit line sense amplifiers connected to the selected memory cells may refresh or restore weights or biases stored in the selected memory cells.

Under control of the command decoder 2430, the data input/output circuit 2460 may process write data (e.g., weights or biases) to be written in the banks 2100 and may transmit (e.g., provide) the write data to the write driver array 2180 of the banks 2100 through the bus 2200 or the programmable router 2300. The data input/output circuit 2460 may control the DQ buffer 2470 and the DQS buffer 2480 for receiving the write data from an external device. Under control of the command decoder 2430, the data input/output circuit 2460 may receive read data including activation signals of the neuron circuit arrays 2120 of the banks 2100 through the bus 2200 or the programmable router 2300 and may process the read data. The data input/output circuit 2460 may control the DQ buffer 2470 and the DQS buffer 2480 for outputting the read data to the external device. The DQ buffer 2470 and the DQS buffer 2480 may respectively receive a write DQ signal including the write data and a write DQS signal for capturing (and/or sampling) the write DQ signal or may respectively transmit a read DQ signal including the read data and a read DQS signal to the outside. Here, the DQ signal may be a bidirectional data input/output signal being the write DQ signal or the read DQ signal, and the DQS signal may be a bidirectional data strobe signal being the write DQS signal or the read DQS signal.

Further, the clock buffer 2410, the command and address buffer 2420, the command decoder 2430, the address demultiplexer 2440, the fresh controller 2450, the data input/output circuit 2460, the DQ buffer 2470, and the DQS buffer 2480 may comprise processing circuitry such as hardware including logic circuits; a hardware/software combination such as a processor executing software; or a combination thereof. For example, the processing circuity more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc."

Figure 17:
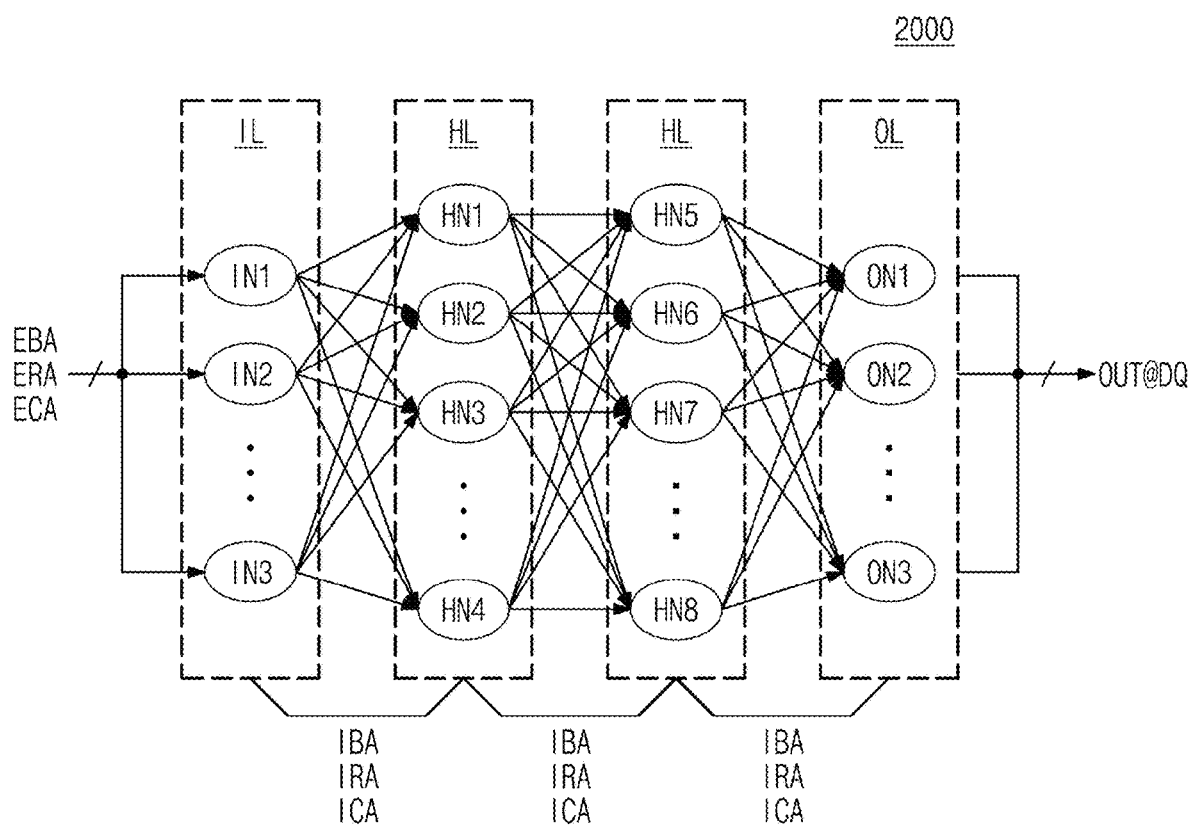
FIG. 17 illustrates an artificial neural network executable by a neuromorphic device of FIG. 16.

FIG. 17 illustrates an artificial neural network executable by a neuromorphic device of FIG. 16. An artificial neural network 2000 may be substantially identical to the artificial neural network ANN of FIG. 1. The external bank address EBA, the external row address ERA, and the external column address ECA included in the command and address signal CA provided to the neuromorphic device 2000 may correspond to input data (e.g., the input data IN of FIG. 1) of the artificial neural network 2000. Various commands included in the command and address signal CA provided to the neuromorphic device 2000 may correspond to the input data of the artificial neural network 2000. Read data included in the read DQ signal output from the neuromorphic device 2000 may correspond to output data (e.g., the output data OUT of FIG. 1) of the artificial neural network 2000. The internal bank address IBA, the internal row address IRA, and the internal column address ICA described above may indicate connections (e.g., synapses) between the nodes IN1 to 11\13 of the input layer IL and the nodes HN1 to HN4 of the hidden layer HL, connections between the nodes HN1 to HN8 of the hidden layers HL, and connections between the nodes HN5 to HN8 of the hidden layer HL and the nodes ON1 to ON3 of the output layer OL.

Figure 18:
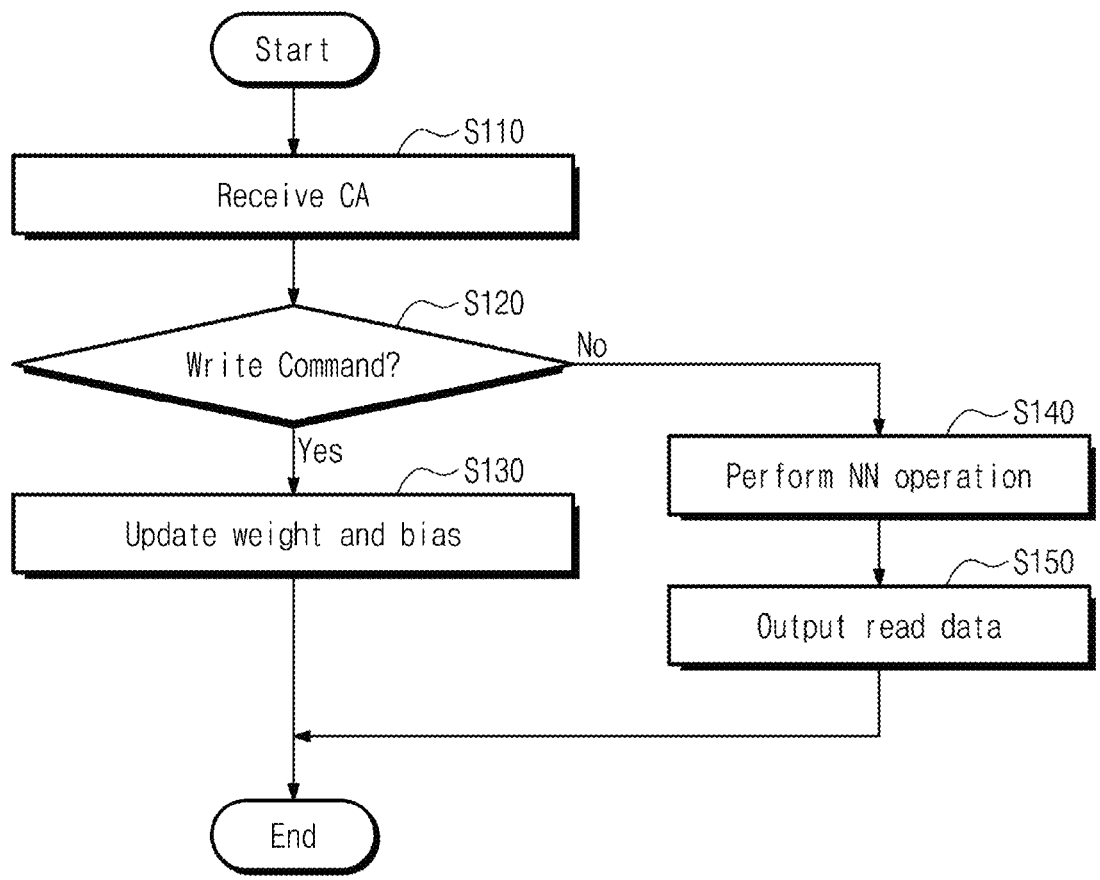
FIG. 18 is a flowchart illustrating an operation method of a neuromorphic device of FIG. 16.

FIG. 18 is a flowchart illustrating an operation method of a neuromorphic device of FIG. 16. In operation S110, the command and address buffer 2420 of the neuromorphic device 2000 may receive the command and address signal CA from an external device. In operation S120, the command decoder 2430 may decode a command and may determine whether a command received in operation S110 is a write command.

When the command is the write command (Y), in operation S130, the command decoder 2430 may select, through the bus 2200, the bank 2100 corresponding to a bank address included in an address received in operation S110. The address demultiplexer 2440 may transmit the external row address ERA and the external column address ECA included in the address received in operation S110 to the bank 2100 corresponding to the bank address through the bus 2200. The DQ buffer 2470 and the DQS buffer 2480 may receive the write DQ signal including the write data and the write DQS signal, and the data input/output circuit 2460 may process the write data and may transmit the write data to the bank 2100 corresponding to the bank address through the bus 2200 or the programmable router 2300. Here, the write data may weights or biases. The row decoder 2160 and the column decoder 2170 of the bank 2100 corresponding to the bank address may select memory cells corresponding to the external row address ERA and the external column address ECA, and the write driver array 2180 may write the write data in the selected memory cells.

When the command is a read command (N), in operation S140, the neuromorphic device 2000 may perform the neural network operation. The command received in operation S110 may be, for example, the read command. In this case, the command and address received in operation S110 may be regarded as input data to be input to the input layer IL of the neural network ANN described with reference to FIG. 1. The command decoder 2430 may select, through the bus 2200, the bank 2100 corresponding to a bank address included in the address received in operation S110. The address demultiplexer 2440 may transmit the external row address ERA and the external column address ECA included in the address received in operation S110 to the bank 2100 corresponding to the bank address through the bus 2200. The neuron circuit array 2120 may sum weights and/or biases stored in the memory cells corresponding to the external row address ERA and the external column address ECA and may output activation signals. That is, word lines and column selection lines corresponding to the external row address ERA and the external column address ECA may perform a role of input data that are input to the input layer IL of the neural network ANN and are multiplied with weights for the input layer IL. The row/column controller 2150 may generate the internal row address IRA and the internal column address ICA based on activation signals. The neuron circuit array 2120 may sum weights and/or biases stored in the memory cells corresponding to the internal row address IRA and the internal column address ICA and may further output activation signals. As the procedure described above is repeated, the neuron circuit array 2120 may be reused. The internal row address IRA and the internal column address ICA may be regarded as input data that are input to the hidden layer HL or the output layer OL of the neural network ANN described with reference to FIG. 1 and are multiplied with weights for the hidden layer HL or the output layer OL. Word lines and column selection lines corresponding to the internal row address IRA and the internal column address ICA may perform a role of input data that are input to the hidden layer HL of the neural network ANN. Also, the programmable router 2300 may generate a bank address corresponding to the another bank 2100 based on activation signals. The row/column controller 2150 of the another bank 2100 may generate the internal row address IRA and the internal column address ICA based on the activation signals provided from the programmable router 2300. The neuron circuit array 2120 of the another bank 2100 may sum weights or biases stored in the memory cells corresponding to the internal row address IRA and the internal column address ICA and may output activation signals. The row/column controller 2150 may further generate the internal row address IRA and the internal column address ICA based on the activation signals. The neuron circuit array 2120 may sum weights and/or biases stored in the memory cells corresponding to the internal row address IRA and the internal column address ICA and may further output activation signals. When the procedure described above is repeated, the neuromorphic device 2000 may perform the neural network operation.

In operation S150, the data input/output circuit 2460 may receive the activation signals from the banks 2100 through the bus 2200 or the programmable router 2300 and may generate read data. Under control of the data input/output circuit 2460, the DQ buffer 2470 and the DQS buffer 2480 may output a read DQ signal including the read data and a DQS signal to the outside.

In an embodiment, the threshold signal TH described with reference to FIGS. 2 to 16 may be decided in advance. In another embodiment, the threshold signal TH may be updated by the command received in operation S110. Information about a voltage level and/or a current level of the threshold signal TH may be stored in a partial area of the memory cell array 1100/2110 or in registers. The command received in operation S110 may be a write command for requesting a write operation of the partial area of the memory cell array 1100/2110, a mode register set command, a mode register write command, a multi-purpose command (MPC), etc. Although not illustrated in FIG. 16, the peripheral circuit 2400 may further include a voltage generator and/or a current generator to generate the threshold signal TH, the command decoder 2430 may update the information about the threshold signal TH stored in the partial area of the memory cell array 1100/2100 or in registers based on the command received in operation S110, and the voltage generator or the current generator may variously change the threshold signal TH with reference to the updated information. For example, the voltage generator or the current generator may generate one threshold signal TH or may generate two or more threshold signals TH. Therefore, the one threshold signal TH may be provided in common to the neuron circuit arrays 2120 of all the banks 2100, or the two or more threshold signals TH may be provided to the neuron circuit arrays 2120 of the banks 2100. That is, the threshold signals TH of the neuron circuit arrays 2120 of the banks 2100 may be identical to or different from each other, and the threshold signals TH of the neuron circuits 1210 to 1230 may be identical to or different from each other.

Figure 19:
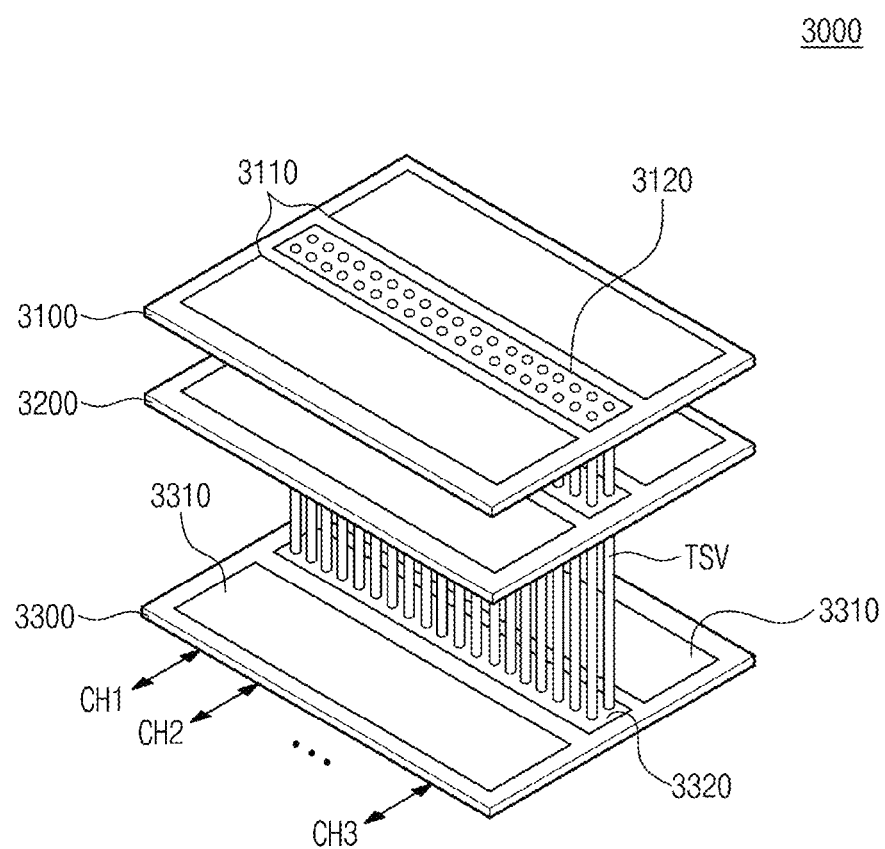
FIG. 19 illustrates a block diagram of a neuromorphic device according to an embodiment of the inventive concepts.

FIG. 19 illustrates a block diagram of a neuromorphic device according to an embodiment of the inventive concepts. A neuromorphic device 3000 may include memory (processing) dies 3100 and 3200 and a buffer die 3300. The neuromorphic device 3000 may include a plurality of channels CH1 to CH3. Here, each of the channels CH1 to CH3 may include the clock signal CK, the command and address signal CA, the DQ signal, and the DQS signal of FIG. 16. Through-silicon vias TSV may provide physical and/or electrical paths between the memory dies 3100 and 3200 and the buffer die 3300.

The memory die 3100 may include active areas 3110 and a transit area 3120. All components of the neuromorphic devices 1000a to 1000e or the components 2100, 2200, and 2300 of the neuromorphic device 2000 described with reference to FIG. 16 may be disposed in the active areas 3110. The through-silicon vias TSV may be disposed in the transit area 3120, or circuits for transmitting or receiving signals through the through-silicon vias TSV may be disposed therein. The memory die 3200 may be implemented to be substantially identical to the memory die 3100.

The buffer die 3300 (e.g., a "core die" or a "logic die") may include active areas 3310 and transit area 3320. Circuits for receiving or outputting signals transmitted from the outside through the channels CH1 to CH3, all the components of the neuromorphic devices 1000a to 1000e, and/or all the components of the neuromorphic device 2000 described with reference to FIG. 16 may be disposed in the active area 3310. The through-silicon vias TSV and/or circuits for transmitting or receiving signals through the through-silicon vias TSV may be disposed in the transit area 3320.

Figure 20:
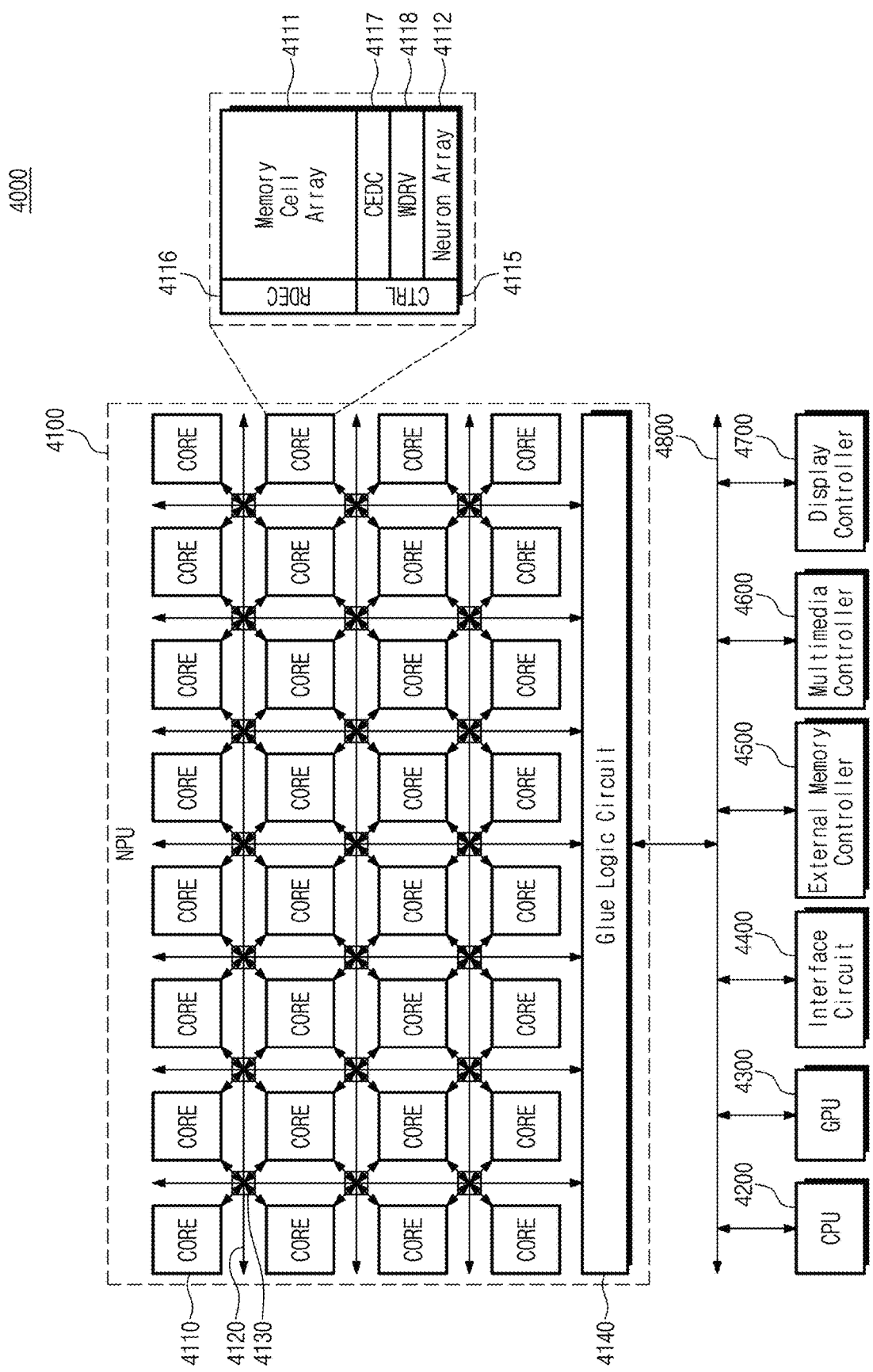
FIG. 20 illustrates a block diagram of a system on chip according to an embodiment of the inventive concepts.

FIG. 20 illustrates a block diagram of a system on chip according to an embodiment of the inventive concepts. A system on chip (SoC) 4000 may be an application processor (AP). The system on chip 4000 may include a neural processing unit (NPU) 4100.

The NPU 4100 may include cores 4110, a bus 4120, programmable routers 4130, and a glue logic circuit 4140. The core 4110 may include a memory cell array 4111, neuron circuit arrays 4112, a row/column controller 4115, a row decoder 4116, a column decoder 4117, and a write driver array 4118. The core 4110 and the components 4111 to 4118 may be substantially identical to the bank 2100 and the components 2110 to 2180. As in the core of the CPU 4200 or the GPU 4300, the core 4110 may fetch, issue, and/or dispatch an instruction and may perform an arithmetic operation, a logic operation, and/or a shift operation of an arithmetic logic unit (ALU). The core 4110 may perform the neural network operation by using the components 4111 to 4118. The bus 4120 and the programmable routers 4130 may be substantially identical to the bus 2200 and the programmable routers 2300 described above.

The glue logic circuit 4140 may include circuits configured to interconnect and interface the cores 4110 and a cache memory shared by the cores 4110. The glue logic circuit 4140 may include at least a part or all of the components 2410 to 2480 of the peripheral circuit 2400 of the neuromorphic device 2000. The glue logic circuit 4140 may communicate with other components 4200 to 4700 in the SoC 4100 through the bus 4800 as an interface circuit of the NPU 4100 and may connect the cores 4310 and a system bus 4800. The system on chip 4000 may include a central processing unit (CPU) 4200, a graphic processing unit (GPU) 4300, an interface circuit 4400 performing communication with an external device or a user device, an external memory controller 4500 controlling an external memory device (not illustrated), a multimedia controller 4600 controlling a multimedia device (not illustrated), a display controller 4700 controlling a display device (not illustrated), and the system bus 4800 providing an interface and communication (or transmission) paths between the components 4100 to 4700.

In some example embodiment, some or all of any of the systems according to any of the example embodiments, including some or all of the peripheral circuit 2400 and the neuron circuit 1200, (including some or all of the integrator 1300, activation circuit 1400, row/column decoder 1500, the row decoder 1600, the column decoder 1700, the address generator 1510, pre-row decoder 1620, the clock buffer 2410, the command and address buffer 2420, the command decoder 2430, the address demultiplexer 2440, the fresh controller 2450, the data input/output circuit 2460, the DQ buffer 2470, and the DQS buffer 2480) may include, may be included in, and/or may be implemented by one or more instances (e.g., articles, pieces, units, etc.) of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, or memory, for example a solid state drive (SSD), storing a program of instructions, and a processor configured to execute the program of instructions to implement the functionality of some or all of any of the systems according to any of the example embodiments. It will be understood that, as described herein, an element (e.g., processing circuitry, digital circuits, etc.) that is described as "implementing" an element (e.g., integrator 1300, activation circuit 1400, row/column decoder 1500, the row decoder 1600, the column decoder 1700, the address generator 1510, and pre-row decoder 1620, etc.) will be understood to implement the functionality of said implemented element (e.g., the functionality of neuron circuit 1200 peripheral circuit 2400, etc.).

A neuromorphic device according to an embodiment of the inventive concepts may operate based on a high-integration and low-power memory. The neuromorphic device may update weights and biases by using a write operation of the memory. The neuromorphic device may perform a neural network operation by using a nondestructive read operation of the memory. The neuromorphic device may increase the number of neuron circuits by reusing the neuron circuits.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A neuromorphic device comprising:
   a first memory cell array including first memory cells corresponding to a first address, the first memory cells configured to store first weights, and second memory cells corresponding to a second address, the second memory cells configured to store second weights; and
   a first neuron circuit including a first integrator and a first activation circuit, the first integrator configured to sum first read signals from the first memory cells and output a first sum signal to the first activation circuit and to sum second read signals from the second memory cells and output second sum signals to the first activation circuit, and the first activation circuit configured to output a first activation signal based on the first sum signal and output a second activation signal based on the second sum signals of the first read signals output from the integrator.

2. The neuromorphic device of claim 1, wherein at least one of the second weights indicates a connection strength between the first neuron circuit receiving the first read signals and the neuron circuit receiving the second read signals.

3. The neuromorphic device of claim 1, further comprising:

an address generator configured to generate the second address based on the first activation signal and to generate a third address based on the second activation signal.

4. The neuromorphic device of claim 3, further comprising:
a row decoder configured to decode a first internal row address of the first address and a second internal row address of the second address, respectively; and
a column decoder configured to decode a first internal column address of the first address and a second internal column address of the second address, respectively,
wherein the row decoder and the column decoder sequentially select the first memory cells and the second memory cells.

5. The neuromorphic device of claim 4, wherein the row decoder is configured to decode the first internal row address to simultaneously select first word lines respectively connected to the first memory cells and to decode the second internal row address to simultaneously select second word lines respectively connected to the second memory cells.

6. The neuromorphic device of claim 5, wherein the row decoder is configured to set an upper bit of a row address bit used to select word lines of sub memory blocks to a Don't Care bit, and
wherein the first word lines and the second word lines are respectively placed in the sub memory blocks.

7. The neuromorphic device of claim 4, wherein the first activation circuit is configured to reset at least one of the row decoder, the column decoder, and the integrator by using at least one of the first activation signal or the second activation signal.

8. The neuromorphic device of claim 7, wherein the first memory cell array further includes:
third memory cells corresponding to the third address, the third memory cells configured to store third weights; and
fourth memory cells corresponding to a fourth address, the fourth memory cells configured to store fourth weights, and
wherein, in response to at least one of the first activation signal or the second activation signal, the column decoder is configured to disable a first column selection signal selecting first bit lines connected to the first memory cells and to the second memory cells, and configured to disable a second column selection signal selecting second bit lines connected to the third memory cells and the fourth memory cells.

9. The neuromorphic device of claim 1 further comprising:
a programmable router configured to generate a bank address based on at least one of the first activation signal or the second activation signal;
a second memory cell array including third memory cells corresponding to the bank address and configured to store third weights; and
a second neuron circuit including a second integrator and a second activation circuit, the second integrator configured to sum third read signals from the third memory cells and output third sum signals, and the second activation circuit configured to output a third activation signal based on the third sum signal of the third read signals, and
wherein at least one of the third weights indicates a connection strength between the first neuron circuit and the second neuron circuit.

10. The neuromorphic device of claim 1, wherein the first memory cells and the second memory cells are configured to each store one or more bits.

11. A neuromorphic device comprising:
a memory cell array including memory cells;
an input/output line, configured to access the memory cells and to write weights into the memory cells; and
a neuron circuit including an integrator and an activation circuit, the integrator configured to sum read signals from the memory cells at the input/output line and output a sum signal to the activation circuit, and the activation circuit configured to receive the sum signal and to output an activation signal based on the sum signal of the read signals output from the integrator.

12. The neuromorphic device of claim 11, further comprising:
a write driver configured to write the weights in the memory cells through the input/output line;
a row decoder configured to select a word line connected to one of the memory cells before one of the weights is written in the one of the memory cells by the write driver and to select all word lines respectively connected to the memory cells before the read signals from the memory cells are output; and
a column decoder configured to select a column selection line through which a column selection signal selecting bit lines connected to the memory cells is transmitted.

13. The neuromorphic device of claim 12, further comprising:
an address generator configured to generate an internal row address and an internal column address based on the activation signal,
wherein the row decoder is configured to decode the internal row address to select all the word lines and to decode an external row address of the neuromorphic device to select the word line connected to the one of the memory cells,
wherein the column decoder is configured to decode the internal column address to select the column selection line and to decode an external column address to select the column selection line, and
wherein the external row address and the external column address correspond to input data of a neural network executed by the memory cell array, the row decoder, the column decoder, and the neuron circuit, and the input data are multiplied with at least a part of the weights.

14. The neuromorphic device of claim 12, wherein
the memory cell array further includes input/output switches configured to transmit the weights through the input/output line to the memory cells, and
wherein the integrator includes local sense amplifiers and a global sense amplifier, the local sense amplifiers configured to simultaneously drive the input/output line based on the read signals respectively sensed by bit line sense amplifiers connected to the bit lines; and the global sense amplifier connected to the input/output line and simultaneously driven by the local sense amplifiers.

15. The neuromorphic device of claim 12, further comprising:
a command decoder configured to decode a first command to control the row decoder, the column decoder, and the write driver and to decode a second command to control the row decoder, the column decoder, and the neuron circuit; and
a data input/output circuit configured to receive the weights under control of the command decoder decoding the first command, provide the weights to the write driver, and output read data based on the activation signal to an external device under control of the command decoder decoding the second command.

16. The neuromorphic device of claim 12, wherein bit line sense amplifiers respectively connected to the bit lines are configured to restore the weights stored in the memory cells.

* * * * *